(12) United States Patent
Yoshioka et al.

(10) Patent No.: US 12,279,373 B2
(45) Date of Patent: *Apr. 15, 2025

(54) DC/DC CONVERTER COMPONENT

(71) Applicant: Murata Manufacturing Co., Ltd., Kyoto-fu (JP)

(72) Inventors: Yoshimasa Yoshioka, Nagaokakyo (JP); Kouji Yamauchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/499,877

(22) Filed: Nov. 1, 2023

(65) Prior Publication Data

US 2024/0064902 A1    Feb. 22, 2024

Related U.S. Application Data

(63) Continuation of application No. 17/410,353, filed on Aug. 24, 2021, now Pat. No. 11,844,177.

(30) Foreign Application Priority Data

Aug. 26, 2020 (JP) .................................. 2020-142761

(51) Int. Cl.
*H05K 1/16* (2006.01)
*H01F 27/28* (2006.01)
(Continued)

(52) U.S. Cl.
CPC ......... *H05K 1/165* (2013.01); *H01F 27/2823* (2013.01); *H01L 28/10* (2013.01); *H02M 3/155* (2013.01); *H05K 1/182* (2013.01)

(58) Field of Classification Search
CPC ................... H05K 1/165; H05K 1/182; H01F 27/2823; H01F 28/10; H02M 3/155
See application file for complete search history.

(56) References Cited

U.S. PATENT DOCUMENTS 8,716,991 B1    5/2014 Ikriannikov
2010/0127812 A1    5/2010 Maeda
(Continued)

FOREIGN PATENT DOCUMENTS

JP    H09-121534 A    5/1997
JP    2007-194474 A    8/2007
(Continued)

OTHER PUBLICATIONS

Anonymous, "Circuit Technology of DC-DC Converters", Power Electronics World Part 3, TDK Techno Magazine, TDK Corporation, Apr. 13, 2021, total 9 pages, https://www.tdk.com/ja/tech-mag/power/003.

(Continued)

*Primary Examiner* — Hoa C Nguyen
(74) *Attorney, Agent, or Firm* — Studebaker Brackett PLLC

(57) ABSTRACT

A DC/DC converter component has a reduced mounting area and includes an inductor component; a semiconductor integrated circuit including a switch circuit connected to the inductor component, and a control circuit that controls the switch circuit; and a package substrate, to which the semiconductor integrated circuit is mounted, having a mounting face that opposes an other substrate when the package substrate is mounted to the other substrate. The inductor component includes an element body, and a plurality of inductor wiring lines, each extending in the element body and in parallel with a main face of the element body. A value of inductance of a second inductor wiring line is 10% or more greater than a value of inductance of a first inductor wiring line. The inductor component has a dimension equal to or less than 0.25 millimeters in a thickness direction, and is mounted to the package substrate.

20 Claims, 17 Drawing Sheets

(51) Int. Cl.
*H01L 49/02* (2006.01)
*H02M 3/155* (2006.01)
*H05K 1/18* (2006.01)

(56) References Cited

U.S. PATENT DOCUMENTS

| | | |
|---|---|---|
| 2010/0328009 A1 | 12/2010 | Tawa |
| 2011/0286144 A1 | 11/2011 | Ikriannikov |
| 2011/0308072 A1 | 12/2011 | Ahn et al. |
| 2012/0056705 A1 | 3/2012 | Kim et al. |
| 2016/0314892 A1* | 10/2016 | Fukushima ......... H01F 17/0013 |
| 2017/0103846 A1 | 4/2017 | Yoneda |
| 2017/0345552 A1 | 11/2017 | Nakano et al. |
| 2017/0365402 A1 | 12/2017 | Fukushima et al. |
| 2019/0074131 A1 | 3/2019 | Yamanaka et al. |
| 2020/0027638 A1 | 1/2020 | Taguchi et al. |
| 2020/0066830 A1 | 2/2020 | Bharath et al. |
| 2020/0098504 A1* | 3/2020 | Shirai ................ H01F 27/245 |
| 2020/0211782 A1* | 7/2020 | Shinkai .................. H01G 4/40 |
| 2021/0065964 A1 | 3/2021 | Otani et al. |
| 2021/0125770 A1* | 4/2021 | Yoshioka ............... H05K 1/165 |

FOREIGN PATENT DOCUMENTS

| | | |
|---|---|---|
| JP | 2007-250924 A | 9/2007 |
| JP | 2017-069523 A | 4/2017 |
| JP | 2018-007357 A | 1/2018 |
| JP | 2018-046051 A | 3/2018 |
| WO | 2007/088914 A1 | 8/2007 |
| WO | 2016/194626 A1 | 12/2016 |

OTHER PUBLICATIONS

Anonymous, "DC-DC Power Supply Circuit Design Guide", ROHM Semiconductor—ROHM Co., Ltd, Dec. 9, 2021, total 2 pages, https://www.rohm.co.jp/dcdc-support.

Anonymous, "Operating Principles of Step-Down DC-DC Converters", Basic Knowledge of Non-Isolated DC-DC Converter Modules, Murata Manufacturing Co., Ltd, Feb. 7, 2024, total 5 pages, https://www.murata.com/ja-jp/products/power/nonisolated-dc-dc-converter/overview/basic/operating-principle.

* cited by examiner

DC/DC CONVERTER COMPONENT

CROSS-REFERENCE TO RELATED APPLICATION

This application is a Continuation of U.S. patent application Ser. No. 17/410,353, filed Aug. 24, 2021, which claims benefit of priority to Japanese Patent Application No. 2020-142761, filed Aug. 26, 2020, the entire content of which is incorporated herein by reference.

BACKGROUND

Technical Field

The present disclosure relates to a DC/DC converter component.

Background Art

JP 2018-007357 A discloses a DC/DC converter component that includes an inductor component and a semiconductor integrated circuit. The semiconductor integrated circuit includes a switch circuit configured to switch supply of a current to the inductor component, and a control circuit configured to control the switch circuit.

SUMMARY

With a DC/DC converter component such as one disclosed in JP 2018-007357 A, in some cases, a semiconductor integrated circuit is mounted to a package substrate. Further, the package substrate is mounted to a motherboard of an electronic device.

With the DC/DC converter component such as the one disclosed in JP 2018-007357 A, an inductor component is relatively larger sized, so as to acquire a desired inductance. Thus, the inductor component is required to be mounted to the motherboard, separately from the package substrate. Accordingly, with a DC/DC converter component of a conventional type, the motherboard is required to have an area for mounting the inductor component together with the package substrate.

In view of the respects described above, the present disclosure provides a DC/DC converter component including an inductor component; a semiconductor integrated circuit including a switch circuit connected to the inductor component, and a control circuit configured to control the switch circuit; and a package substrate to which the semiconductor integrated circuit is mounted. The package substrate has a mounting face configured to oppose an other substrate when the package substrate is mounted to the other substrate. The inductor component includes an element body including a magnetic layer formed of a magnetic material, and having a main face in parallel with the mounting face; a plurality of inductor wiring lines, each extending in the element body and in parallel with the main face; and a vertical wiring line extending from each of the inductor wiring lines in a thickness direction orthogonal to the main face, so as to be exposed from the main face. Each of the inductor wiring lines has a number of turns equal to or less than 0.5 turns. A value of an inductance of a second inductor wiring line being 10% or more greater than a value of an inductance of a first inductor wiring line, when one of the plurality of inductor wiring lines corresponds to the first inductor wiring line, and when an other one of the plurality of inductor wiring lines that is different from the first inductor wiring line corresponds to the second inductor wiring line. The inductor component has, in the thickness direction, a dimension equal to or less than 0.25 millimeters, and the inductor component is mounted to the package substrate.

According to a configuration described above, the inductor component is mounted to the package substrate. Accordingly, when the package substrate is mounted to the other substrate, the inductor component is to be also mounted to the other substrate. Here, the other substrate is not required to secure an area for mounting the inductor component. In other words, the DC/DC converter component, having the configuration described above, requires a reduced mounting area.

The present disclosure provides a DC/DC converter component configured to require a reduced mounting area.

DETAILED DESCRIPTION

A DC/DC converter component according to an embodiment will be described below. Note that, in each of the drawings, constituent elements may be enlarged for ease of understanding. Dimensional ratios of the constituent elements in each of the drawings may differ from the actual ratios or may differ from the ratios in others of the drawings.

The DC/DC converter component is included in an electronic device, and first, a circuit configuration of the electronic device will be described.

Figure 1:
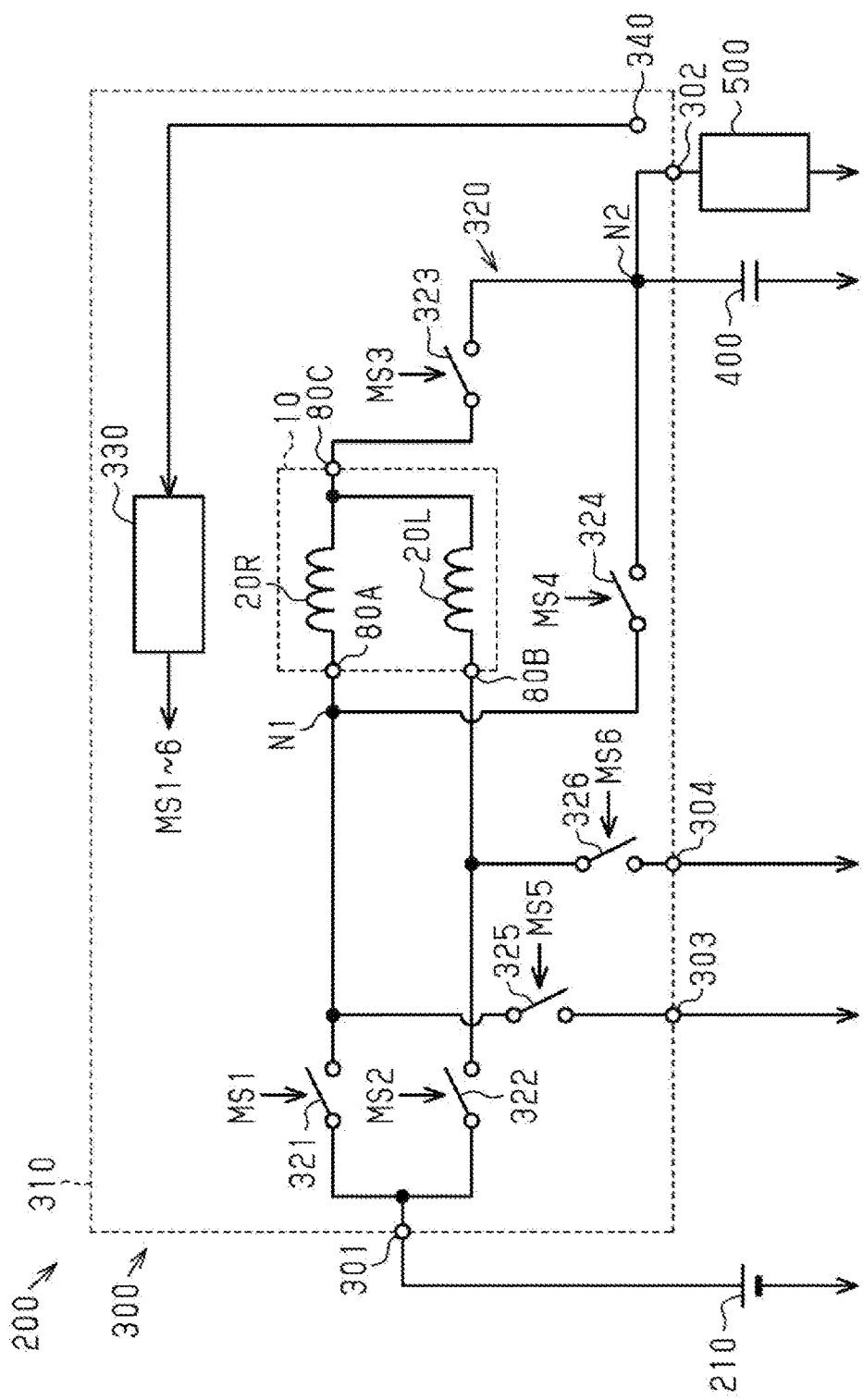
FIG. 1 is a schematic diagram of an electronic device including a DC/DC converter component according to an embodiment.

As illustrated in FIG. 1, an electronic device 200 includes a power supply 210 for applying a DC voltage. The power supply 210 has a low potential terminal connected to a ground. The power supply 210 also has a high potential terminal connected to an input terminal 301 of a DC/DC converter component 300. The input terminal 301 has a power supply voltage inputted. The DC/DC converter component 300 steps down the DC voltage inputted, and outputs the DC voltage stepped down. In other words, the DC/DC converter component 300 operates as a step-down converter. The DC/DC converter component 300 has, at its output side, a capacitor 400 connected thereto, the capacitor 400 for smoothing the voltage. The DC/DC converter component 300 also has an output terminal 302, to which a microprocessor 500 as a load is connected in parallel with the capacitor 400. Note that, each of the microprocessor 500 and the capacitor 400 is connected to the ground.

The DC/DC converter component 300 includes a first switching element 321 and a second switching element 322. The first switching element 321 has a first end connected to a first terminal 80A of an inductor component 10. The first switching element 321 has a second end connected to the input terminal 301. The second switching element 322 has a first end connected to a second terminal 80B of the inductor component 10. The second switching element 322 has a second end connected to the input terminal 301. In other words, the first switching element 321 and the second switching element 322 are connected in parallel to the power supply 210.

The inductor component 10 has a third terminal 80C, to which a first end of a third switching element 323 is connected. The third switching element 323 has a second end connected to each of the capacitor 400 and the microprocessor 500.

The first end of the first switching element 321 and the first terminal 80A of the inductor component 10 have a node therebetween; and when the node is referred to as a node N1, a first end of a fourth switching element 324 is connected to the node N1. The fourth switching element 324 has a second end connected to a node N2 between the third switching element 323 and the capacitor 400.

The DC/DC converter component 300 includes a fifth switching element 325. The fifth switching element 325 has a first end connected to between the first end of the first switching element 321 and the first terminal 80A. The fifth switching element 325 has a second end connected to the ground with a first grounding terminal 303 interposed therebetween. Note that, "grounding" signifies a connection to the ground as a reference potential, and is thus not limited to a connection to an earth ground.

The DC/DC converter component 300 also includes a sixth switching element 326. The switching element 326 has a first end connected to between the first end of the second switching element 322 and the second terminal 80B. The sixth switching element 326 has a second end connected to the ground with a second grounding terminal 304 interposed therebetween.

Each of the switching elements 321 to 326 is, for example, a field effect transistor. Each of the switching elements 321 to 326 is controlled to be in an on-state or an off-state by a control circuit 330. The control circuit 330 has a current value of a direct current inputted, the direct current flowing to the microprocessor 500 (as the load); and the current value is detected by an ammeter 340. Based on the current value inputted, the control circuit 330 transmits a signal, MS1, MS2, MS3, MS4, MS5, or MS6 to each of the switching elements 321 to 326, the signals MS1 to MS6 indicating the on-state or the off-state, so as to switch a corresponding one of the switching elements 321 to 326 between the on-state and the off-state.

When the DC/DC converter component 300 functions, any one of the first switching element 321 and the second switching element 322 is repeatedly switched between the on-state and the off-state. Alternatively, when the DC/DC converter component 300 functions, the first switching element 321 and the second switching element 322 are repeatedly and synchronously switched between the on-state and the off-state. In this state, the fifth switching element 325 is turned on/off complementarily to the first switching element 321 that is repeatedly turned on/off. Similarly, in this state, the sixth switching element 326 is turned on/off complementarily to the second switching element 322 that is repeatedly turned on/off. With this configuration, when the first switching element 321 is in the off-state, the first terminal 80A is to be connected to the first grounding terminal 303 for grounding of the DC/DC converter component 300. Similarly, when the second switching element 322 is in the off-state, the second terminal 80B is to be connected to the second grounding terminal 304 for grounding of the DC/DC converter component 300.

Next, the inductor component 10 will be described in detail.

Figure 2:
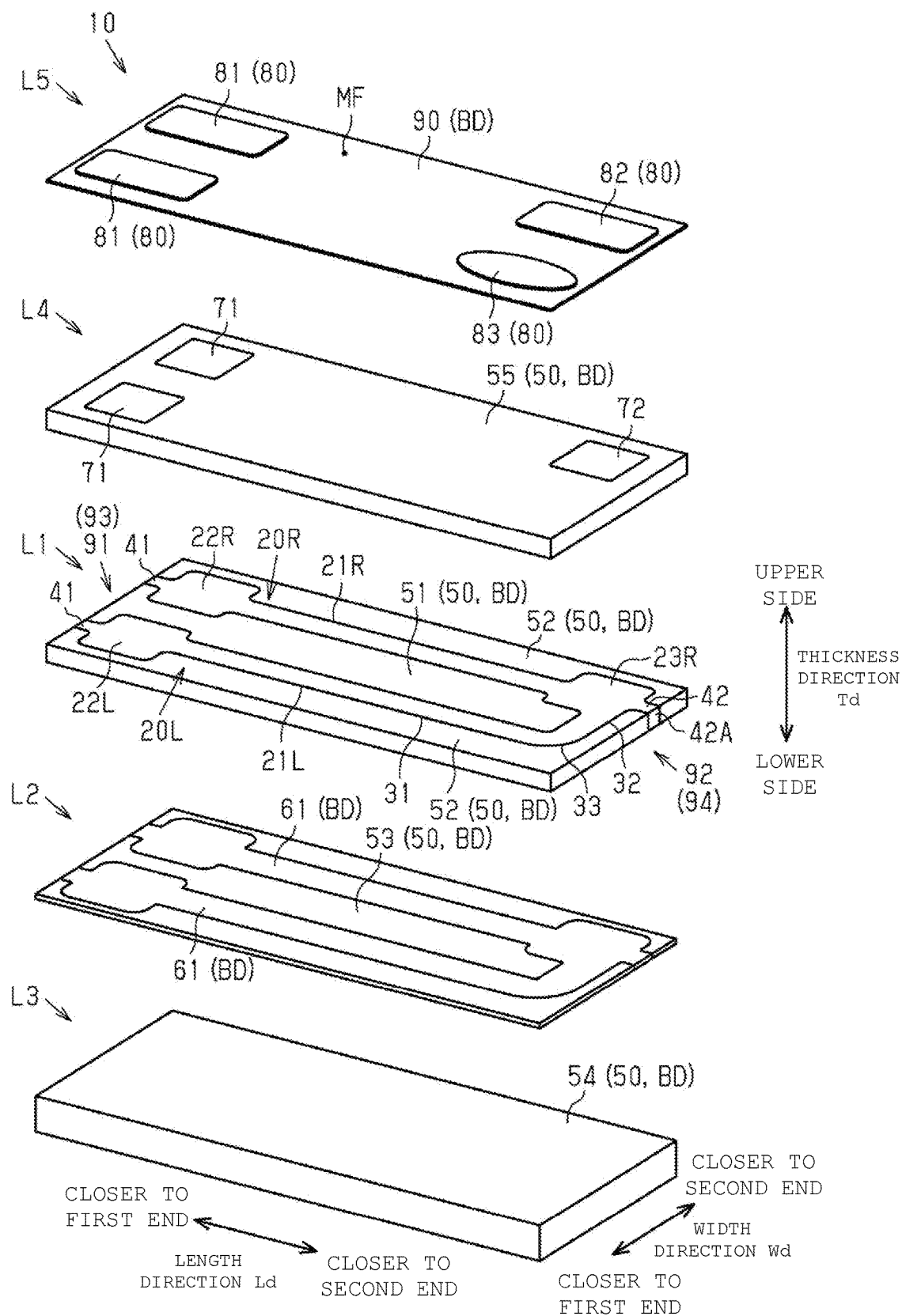
FIG. 2 is an exploded perspective view of an inductor component.

As illustrated in FIG. 2, the inductor component 10 has an overall configuration where five layers are laminated in a thickness direction Td. Note that, in descriptions below, one side in the thickness direction Td is to be referred to as an upper side, and the opposite side in the thickness direction is to be referred to as a lower side.

A first layer L1 includes a first inductor wiring line 20R, a second inductor wiring line 20L, first support wiring lines 41, a second support wiring line 42, an inner magnetic path 51, and an outer magnetic path 52.

The first layer L1 has a rectangular shape when viewed in the thickness direction Td. Note that, a direction in parallel with a longer side of the rectangular shape is referred to as a length direction Ld, and a direction in parallel with a shorter side of the rectangular shape is referred to as a width direction Wd.

The first inductor wiring line 20R includes a first wiring line body 21R, a first pad 22R, and a second pad 23R. The first pad 22R is provided at a first end portion of the first wiring line body 21R, and the second pad 23R is provided at a second end portion of the first wiring line body 21R. The first wiring line body 21R extends linearly in the length direction Ld of the first layer L1. The first wiring line body 21R has the first end portion closer to a first end in the length direction Ld, the first end portion to which the first pad 22R is connected. Note that, each of the wiring line bodies 21 may have its first end portion (closer to the first end in the length direction Ld) greater and more spread out than its central portion in the length direction Ld.

The first pad 22R is greater in dimension in the width direction Wd than the first wiring line body 21R. The first pad 22R has a substantially square shape when viewed in the thickness direction Td.

The first wiring line body 21R has a second end portion closer to a second end in the length direction Ld, the second end portion to which the second pad 23R is connected. Note that, each of the wiring line bodies 21 may have its second end portion (closer to the second end in the length direction Ld) greater and more spread out than its central portion in the length direction Ld.

The second pad 23R is greater in dimension in the width direction Wd than the first wiring line body 21R. The second pad 23R has the same substantially square shape as the first pad 22R, when viewed in the thickness direction Td. Note that, the first inductor wiring line 20R is arranged closer to the second end of the first layer L1 in the width direction Wd.

The second inductor wiring line 20L includes a second wiring line body 21L, a first pad 22L, and the second pad 23R. The second pad 22L is provided at a first end portion of the second wiring line body 21L, and the second pad 23R is provided at a second end portion of the second wiring line body 21L.

The second wiring line body 21L has two straight line portions and a portion connecting the two straight line portions, and extends in an overall L shape. Specifically, the second wiring line body 21L has a long straight line portion 31, a short straight line portion 32, and a connecting portion 33. The long straight line portion 31 extends in the length direction Ld, the short straight line portion 32 extends in the width direction Wd, and the connecting portion 33 connects these two straight line portions.

Figure 3:
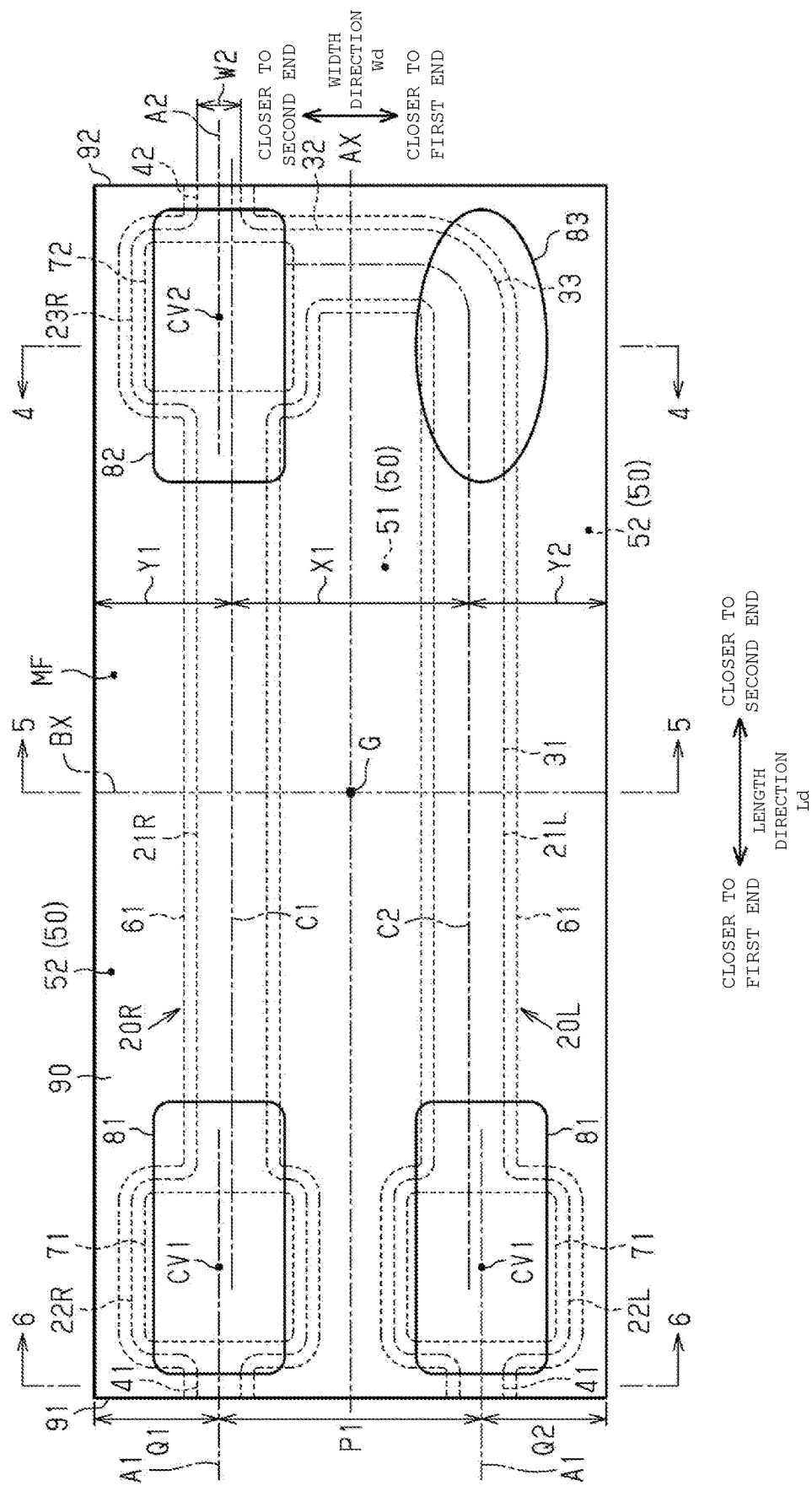
FIG. 3 is a transparent top view of the inductor component.

As illustrated in FIG. 3, a straight line passes through a center of the first layer L1 in the width direction Wd and extends in the length direction Ld. When the straight line is referred to as a symmetrical axis AX, the long straight line portion 31 and the first wiring line body 21R are arranged line-symmetrically with respect to the symmetrical axis AX. The long straight line portion 31 is slightly greater in length in the length direction Ld than the first wiring line body 21R. Concurrently, the long straight line portion 31 is equal in dimension in the width direction Wd to the first wiring line body 21R. The long straight line portion 31 has a first end closer to the first end in the length direction Ld, and has its first end connected to the first pad 22L. The long straight line portion 31 has a second end closer to the second end in the length direction Ld, and has its second end connected to a first end of the connecting portion 33.

The connecting portion 33 has an end that is not connected to the long straight line portion 31, the end opposing the second end side in the width direction Wd. In other words, in the second wiring line body 21L, the connecting portion 33 curves 90 degrees from the first end side in the length direction Ld to the second end side in the width direction Wd.

The connecting portion 33 is, at the end opposing the second end in the width direction Wd, connected to the short straight line portion 32. Note that, the short straight line portion 32 may have its second end portion (closer to the second end in the width direction Wd) greater and more spread out than its central portion in the width direction.

The short straight line portion 32 has, in its length direction Ld, a dimension equal to the dimension that the long straight line portion 31 has in its width direction. The short straight line portion 32 is, at the end closer to the second end in the width direction Wd, connected to the second pad 23R that has been connected to the first wiring line body 21R. In other words, the second pad 23R of the first inductor wiring line 20R is identical to the second pad 23R of the second inductor wiring line 20L. The inductor wiring lines 20 as these two inductor wiring lines exist on the same plane. In other words, the two inductor wiring lines 20 are connected to each other in the inductor component 10.

The number of turns of the second inductor wiring line 20L is determined based on a virtual vector. The virtual vector has a starting point arranged on a central axis C2 that passes through a center of a wiring line width of the second wiring line body 21L and extends in a direction where the second wiring line body 21L extends. Then, when viewed in the thickness direction Td, the starting point arranged on the second wiring line body 21L is moved from the first end to a second end of the central axis C2. In this state, when an orientation of the virtual vector is rotated 360 degrees, the number of turns is defined as 1.0 turn. However, when the orientation of the virtual vector is wound a plurality of times, and when the virtual vector is continuously wound in the same direction, the number of turns is to increase. When the virtual vector is wound in a direction different from the direction where the virtual vector was previously wound, the number of turns is to be recounted from 0 turns. For example, when the virtual vector is wound 180 degrees clockwise and then is wound 180 degrees counterclockwise, the number of turns is to be 0.5 turns. Thus, for example, when the virtual vector is wound 180 degrees, the number of turns is to be 0.5 turns. In this embodiment, a direction of the virtual vector, virtually arranged on the second wiring line body 21L, is rotated 90 degrees at the connecting portion 33. With this configuration, the number of turns of the second wiring line body 21L is 0.25 turns. Note that, the central axis C2 of the second wiring line body 21L corresponds to a line following an intermediate point of the second wiring line body 21L in a direction orthogonal to the direction where the second wiring line body 21L extends. In other words, the central axis C2 of the second wiring line body 21L has a substantially L shape when viewed in the thickness direction Td.

As illustrated in FIG. 3, the first pad 22L is connected to an end of the long straight line portion 31 of the second wiring line body 21L closer to the first end in the length direction Ld. The first pad 22L has the same shape as the first pad 22R connected to the first wiring line body 21R. In other words, the first pad 22L has the substantially square shape when viewed in the thickness direction Td. Concurrently, the first pad 22L and the first pad 22R (that is connected to the first wiring line body 21R) are arranged line-symmetrically with respect to the symmetrical axis AX.

In the first layer L1, one of the first support wiring lines 41 extends from a side opposing the first wiring line body 21R across the first pad 22R. In other words, the one of the first support wiring lines 41 extends from an edge of the first pad 22R, the edge closer to the first end side in the length direction Ld. The one of the first support wiring lines 41 extends linearly in parallel with the length direction Ld. The one of the first support wiring lines 41 extends to a first side face 91 of the first layer L1, the first side face 91 closer to the first end in the length direction Ld, and is exposed to the first side face 91. Similarly, in the first layer L1, the other of the first support wiring lines 41 also extends from a side opposing the second wiring line body 21L across the first pad 22L.

In the first layer L1, the second support wiring line 42 extends from a side opposing the first wiring line body 21R across the second pad 23R. In other words, the second support wiring line 42 extends from an edge of the second pad 23R, the edge closer to the second end in the length direction Ld. The second support wiring line 42 extends linearly in parallel with the length direction Ld. The second support wiring line 42 extends to a second side face 92 of the first layer L1, the second side face closer to the second end in the length direction Ld, and is exposed to the second side face 92. Note that, in this embodiment, no support wiring line is provided at a side opposing the short straight line portion 32 of the second wiring line body 21L across the second pad 23R.

Each of the first inductor wiring line 20R and the second inductor wiring line 20L is formed of a conductive material. In this embodiment, each of the first inductor wiring line 20R and the second inductor wiring line 20L may be comprised of 99 or more wt % of copper and 0.1 or more wt % to 1.0 or less wt % (i.e., from 0.1 to 1.0 wt %) of sulfur.

Each of the first support wiring lines 41 and the second support wiring line 42 is formed of the same conductive material as that of the first inductor wiring line 20R and the second inductor wiring line 20L. However, a part of each of the first support wiring lines 41 is formed of Cu oxide, the part including an exposed face 41A that is exposed to the first side face 91. Similarly, a part of the second support wiring line 42 is formed of Cu oxide, the part including an exposed face 42A that is exposed to the second side face 92.

As illustrated in FIG. 2, in the first layer L1, a region between the first inductor wiring line 20R and the second inductor wiring line 20L corresponds to the inner magnetic path 51. The inner magnetic path 51 is formed of a magnetic material. Specifically, the inner magnetic path 51 is formed of an organic resin material containing metal magnetic powder made of an iron-silica-based alloy or an amorphous alloy thereof. The metal magnetic powder is an alloy containing iron, and an average particle diameter of the metal magnetic powder may be approximately 5 micrometers.

Note that, in this embodiment, a particle diameter of the metal magnetic powder represents the greatest length among line segments drawn from an edge to an edge of a sectional shape of the metal magnetic powder, the sectional shape appearing in a sectional view of the inner magnetic path 51. The average particle diameter corresponds to an average of the particle diameters of the metal magnetic powder at three or more points selected at random, the metal magnetic powder appearing in the sectional view of the inner magnetic path 51.

In the first layer L1, when viewed in the thickness direction Td, the outer magnetic path 52 corresponds to each of a region closer to the second end in the width direction Wd with respect to the first inductor wiring line 20R and a region closer to the first end in the width direction Wd with respect to the second inductor wiring line 20L. The outer magnetic path 52 is formed of the same magnetic material as that of the inner magnetic path 51.

In this embodiment, the first layer L1 has a dimension of approximately 40 micrometers in the thickness direction Td; in other words, each of the inductor wiring lines 20, the first support wiring lines 41, and the second support wiring line 42 has the dimension of approximately 40 micrometers in the thickness direction Td.

The first layer L1 has a lower face as a face at the lower side in the thickness direction Td; and on the lower face, a second layer L2 is laminated. The second layer L2 has the same rectangular shape as that of the first layer L1 when viewed in the thickness direction Td. The second layer L2 includes insulating resin bands 61, the number of which is two, and an insulating resin magnetic layer 53.

The insulating resin bands 61 cover the first inductor wiring line 20R, the second inductor wiring line 20L, the first support wiring lines 41, and the second support wiring line 42 from the lower side in the thickness direction Td. When viewed in the thickness direction Td, the insulating resin bands 61 are shaped to cover a region slightly greater than an outer edge of each of the first inductor wiring line 20R, the second inductor wiring line 20L, the first support wiring lines 41, and the second support wiring line 42. Consequently, one of the insulating resin bands 61 has a linear band shape. The other of the insulating resin bands 61 has a band shape extending in a substantially L shape. Each of the insulating resin bands 61 is formed of an insulating resin material, and this embodiment employs, for example, a polyimide-based resin material. Each of the insulating resin bands 61 has higher insulating properties than the inductor wiring lines 20. The insulating resin bands 61, the number of which is two, are arranged and aligned in the width direction Wd in accordance with the number and arrangement of the inductor wiring lines 20. Concurrently, the insulating resin bands 61 are connected to each other at end portions thereof.

In the second layer L2, the insulating resin magnetic layer 53 corresponds to a portion excluding the two insulating resin bands 61. The insulating resin magnetic layer 53 is formed of the same magnetic material as that of each of the inner magnetic path 51 and the outer magnetic path 52.

The second layer L2 has a lower face as a face at the lower side in the thickness direction Td; and on the lower face, a third layer L3 is laminated. The third layer L3 has the same rectangular shape as that of the second layer L2 when viewed in the thickness direction Td. The third layer L3 corresponds to a first magnetic layer 54. Thus, the first magnetic layer 54 is arranged below the inductor wiring lines 20. The first magnetic layer 54 is formed of the organic resin material (containing the same metal magnetic powder) as that of each of the inner magnetic path 51, the outer magnetic path 52, and the insulating resin magnetic layer 53.

On the other hand, the first layer L1 has an upper face as a face at the upper side in the thickness direction Td; and on the upper face, a fourth layer L4 is laminated. The fourth layer L4 has the same rectangular shape as that of the first layer L1 when viewed in the thickness direction Td. The fourth layer L4 includes first vertical wiring lines 71, the number of which is two, a second vertical wiring line 72, and a second magnetic layer 55.

One of the first vertical wiring lines 71 and an upper face of the first pad 22R in the first inductor wiring line 20R are directly connected to each other without any other layer interposed therebetween. In other words, the first pad 22R has the one of the first vertical wiring lines 71, the first end portion of the first wiring line body 21R, and the one of the first support wiring lines 41 connected thereto. Similarly, the other of the first vertical wiring lines 71 and an upper face of the first pad 22L in the second inductor wiring line 20L are directly connected to each other without any other layer interposed therebetween. In other words, the first pad 22L has the other of the first vertical wiring lines 71, the first end portion of the second wiring line body 21L, and the other of the first support wiring lines 41 connected thereto. The first vertical wiring lines 71, the number of which is two, are arranged line-symmetrically with respect to the symmetrical axis AX. Each of the first vertical wiring lines 71 is formed of the same material as that of each of the first inductor wiring line 20R and the second inductor wiring line 20L. Each of the first vertical wiring lines 71 has a shape of a regular quadrangular prism, the axis of which extends in a direction aligned with the thickness direction Td.

As illustrated in FIG. 3, when viewed in the thickness direction Td, the one of the first vertical wiring lines 71, having the square shape, has a dimension of each side that is slightly smaller than the dimension of each side of the first pad 22R having the square shape. With this configuration, the first pad 22R is greater in area than the one of the first vertical wiring lines 71 at a point where the first pad 22R and the one of the first vertical wiring lines 71 are connected. Note that, when viewed from the upper side in the thickness direction Td, a central axis CV1 of the one of the first vertical wiring lines 71 is aligned with a geometric center of the first pad 22R having the substantially square shape. The number of the first vertical wiring lines 71 is two in correspondence to the number of the first pads 22R.

As illustrated in FIG. 2, the second vertical wiring line 72 and an upper face of the second pad 23R in the first inductor wiring line 20R are directly connected to each other without any other layer interposed therebetween. In other words, the second pad 23R has the second vertical wiring line 72, the second end portion of the first wiring line body 21R, the second end portion of the second wiring line body 21L, and the second support wiring line 42 connected thereto. The second vertical wiring line 72 is formed of the same material as that of the first inductor wiring line 20R. The second vertical wiring line 72 has a shape of a regular quadrangular prism, the axis of which extends in the direction aligned with the thickness direction Td.

As illustrated in FIG. 3, when viewed in the thickness direction Td, the second vertical wiring line 72, having the square shape, has a dimension of each side that is slightly smaller than the dimension of each side of the second pad 23R having the square shape. With this configuration, the second pad 23R is greater in area than the second vertical wiring line 72 at a point where the second pad 23R and the second vertical wiring line 72 are connected. Note that, when viewed from the upper side in the thickness direction Td, a central axis CV2 of the second vertical wiring line 72 is aligned with a geometric center of the second pad 23R having the substantially square shape. The number of the second vertical wiring line 72 is one in correspondence to the number of the second pad 23R.

As illustrated in FIG. 2, in the fourth layer L4, the second magnetic layer 55 corresponds to a portion excluding the first vertical wiring lines 71 (the number of which is two) and the second vertical wiring line 72 (the number of which is one). Thus, the second magnetic layer 55 is laminated on an upper face of each of the inductor wiring line 20L, the inductor wiring line 20R, the support wiring lines 41, and the support wiring line 42. In other words, each of the support wiring lines 41 and the support wiring line 42 are directly in contact with the second magnetic layer 55. The magnetic layer 55 is formed of the same magnetic material as that of the first magnetic layer 54.

In the inductor component 10, a magnetic layer 50 includes the inner magnetic path 51, the outer magnetic path 52, the insulating resin magnetic layer 53, the first magnetic layer 54, and the second magnetic layer 55. The inner magnetic path 51, the outer magnetic path 52, the insulating resin magnetic layer 53, the first magnetic layer 54, and the second magnetic layer 55 are connected to surround the first inductor wiring line 20R and the second inductor wiring line 20L. With this configuration, the magnetic layer 50 has a closed magnetic circuit for the first inductor wiring line 20R and the second inductor wiring line 20L. Thus, each of the first inductor wiring line 20R and the second inductor wiring line 20L extends inside the magnetic layer 50. Note that, the inner magnetic path 51, the outer magnetic path 52, the insulating resin magnetic layer 53, the first magnetic layer 54, and the second magnetic layer 55 are illustrated separately here, but may be integrated as the magnetic layer 50 such that a boundary is not identified.

The fourth layer L4 has an upper face as a face at the upper side in the thickness direction Td; and on the upper face, a fifth layer L5 is laminated. The fifth layer L5 has the same rectangular shape as that of the fourth layer L4 when viewed in the thickness direction Td. The fifth layer L5 includes four terminals 80 and an insulating layer 90. Two of the four terminals 80 correspond to first external terminals 81, each electrically connected to a corresponding one of the first vertical wiring lines 71. One of the four terminals 80 corresponds to a second external terminal 82 that is electrically connected to the second vertical wiring line 72. The four terminals 80 include a remaining one in addition to the first external terminals 81 and the second external terminal 82. The remaining one corresponds to a dummy portion 83 that is not electrically connected to the first inductor wiring line 20R or the second inductor wiring line 20L.

As illustrated in FIG. 3, when a virtual straight line BX is drawn, the virtual straight line BX passing through a center of the fifth layer L5 in the length direction Ld and extending in parallel with the width direction Wd, the virtual straight line BX crosses the symmetrical axis AX described above at a point on an upper face of the fifth layer L5, the point corresponding to a geometric center G of the fifth layer L5. The four terminals 80 are, when viewed in the thickness direction Td, arranged doubly symmetrically with respect to the geometric center G of the fifth layer L5.

Each of the first external terminals 81 and an upper face of the corresponding one of the first vertical wiring lines 71 are directly connected to each other without any other layer interposed therebetween. Each of the first external terminals 81 has a rectangular shape when viewed in the thickness direction Td, and is also located on the second magnetic layer 55. Each of the first external terminals 81 has an area in contact with the corresponding one of the first vertical wiring lines 71, the area equal to or less than half of an entire area of the first external terminal 81. Each of the first external terminals 81, having the rectangular shape, has a longer side extending in parallel with the length direction Ld of the fifth layer L5, and has a shorter side extending in parallel with the width direction Wd of the fifth layer L5. The number of the first external terminals 81 is two in correspondence to the number of the first vertical wiring lines 71.

The second external terminal 82 and an upper face of the second vertical wiring line 72 are directly connected to each other without any other layer interposed therebetween. The second external terminal 82 has an area in contact with the second vertical wiring line 72, the area equal to or less than half of an entire area of the second external terminal 82. The second external terminal 82 has a rectangular shape when viewed in the thickness direction Td, and is also located on the second magnetic layer 55. The second external terminal 82, having the rectangular shape, has a longer side extending in parallel with the length direction Ld of the fifth layer L5, and has a shorter side extending in parallel with the width direction Wd of the fifth layer L5.

Figure 4:
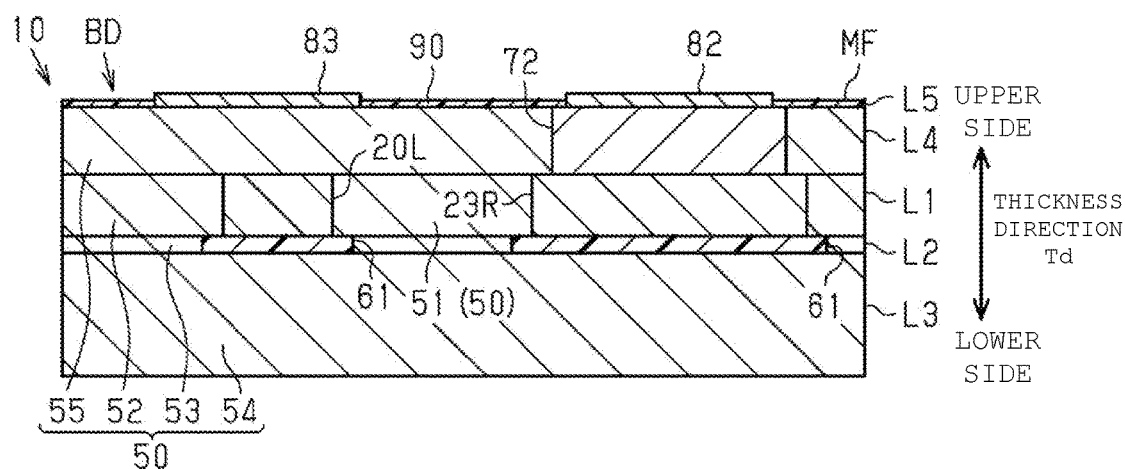
FIG. 4 is a sectional view of the inductor component taken along line 4-4 in FIG. 3.

As illustrated in FIG. 2, one of the four terminals 80 corresponds to the dummy portion 83. As illustrated in FIG. 4, the dummy portion 83 and an upper face of the second magnetic layer 55 of the fourth layer L4 are directly connected without any other layer interposed therebetween. As illustrated in FIG. 3, when viewed in the thickness direction Td, the dummy portion 83 has a different shape from that of each of the first external terminals 81 and the second external terminal 82. In this embodiment, the dummy portion 83 has an elliptical shape when viewed in the thickness direction Td. On the other hand, the shape of the dummy portion 83 is not limited thereto; alternatively, the shape may be, for example, a rectangular shape or a circular shape, the rectangular shape different from that of each of the first external terminals 81 and the second external terminal 82. The dummy portion 83 of the elliptical shape has a longer axis extending in parallel with the length direction Ld of the fifth layer L5, and has a shorter axis extending in parallel with the width direction Wd of the fifth layer L5.

When viewed in the thickness direction Td, the dummy portion 83 has its major part overlapped with the second inductor wiring line 20L. More specifically, when viewed in the thickness direction Td, the dummy portion 83 is arranged at a position overlapping the connecting portion 33 in the second inductor wiring line 20L. Further, when viewed in the thickness direction Td, the dummy portion 83 has an area as large as the area of each of the first external terminals 81 and the second external terminal 82. Note that, with regard to the area "as large as the area", manufacturing deviation is tolerated in this embodiment. Accordingly, when a difference in area between the dummy portion 83 and each of the first external terminals 81 and the second external terminal 82 is within ±10%, the dummy portion 83 is considered to have the area as large as that of each of the first external terminals 81 and the second external terminal 82.

The four terminals 80 are formed of a plurality of conductive layers. Specifically, the four terminals 80 are formed of three layers, i.e., a copper layer, a nickel layer, and a gold layer. When viewed in the thickness direction Td, the second magnetic layer 55 and each of the first vertical wiring lines 71, provided beneath the first external terminals 81 in the thickness direction Td, may be viewed through at corresponding one of the first external terminals 81. Each of the first external terminals 81 has a region, through which the corresponding one of the first vertical wiring lines 71 may be viewed in the thickness direction Td, the region sized equal to or less than half of the area of the first external terminal 81.

Similarly, the second magnetic layer 55 and the second vertical wiring line 72, provided beneath the second external terminal 82 in the thickness direction Td, may be viewed through at the second external terminal 82. The second external terminal 82 has a region, through which the second vertical wiring line 72 may be viewed in the thickness direction Td, the region sized equal to or less than half of the area of the second external terminal 82.

The second magnetic layer 55, provided beneath the dummy portion 83 in the thickness direction Td, may be viewed through the dummy portion 83. On the other hand, each of the first external terminals 81 has a region, through which the second magnetic layer 55 may be viewed, the region sized equal to or more than half of the area of the first external terminal 81. The second external terminal 82 has a region, through which the second magnetic layer 55 may be viewed, the region sized equal to or more than half of the area of the second external terminal 82. In other words, when viewed in the thickness direction Td, an entire part of the dummy portion 83, the region sized equal to or more than half of the area of each of the first external terminals 81, and the region sized equal to or more than half of the area of the second external terminal 82 have the optically same color. With regard to the "same color", for example, when a color difference meter is used and a difference in RGB color value is within a predetermined range, the colors are considered the same. The predetermined range corresponds to, for example, 10%.

In the fifth layer L5, the insulating layer 90 corresponds to a portion excluding the four terminals 80. In other words, on the upper face of the fourth layer L4, the insulating layer 90 of the fifth layer L5 covers a region that is not covered with the first external terminals 81 (the number of which is two), the second external terminal 82, or the dummy portion 83. When viewed in the thickness direction Td, each of the four terminals 80 has an outer edge in contact with the insulating layer 90. The insulating layer 90 is greater in insulation than the magnetic layer 50, and in this embodiment, the insulating layer 90 is formed of a solder resist. The insulating layer 90 is smaller in dimension in the thickness direction Td than any one of the four terminals 80.

In this embodiment, an element body BD is formed of the magnetic layer 50, the insulating resin bands 61, and the insulating layer 90. In other words, the element body BD has a rectangular shape when viewed in the thickness direction Td. In this embodiment, the element body BD has a dimension of, for example, approximately 0.2 millimeters in the thickness direction. In the inductor component 10, the element body BD corresponds to a portion excluding the conductive wiring lines and terminals; and the element body BD has insulation. Concurrently, as has been described above, the element body BD has a cuboid shape, and excludes any protruding part of members. Note that, when the element body BD has the cuboid shape, the element body BD includes the portions laminated.

The insulating layer 90 has an upper face in the thickness direction Td, the upper face corresponding to a main face MF of the element body BD. With this configuration, each of the inductor wiring lines 20 extends in parallel with the main face MF of the element body BD. Further, each of the first vertical wiring lines 71 extends in the thickness direction Td from the first pad 22R or the first pad 22L of a corresponding one of the inductor wiring lines 20 toward the main face MF. Each of the first vertical wiring lines 71 is exposed from the main face MF. The second vertical wiring line 72 extends in the thickness direction Td from the second pad 23R of the corresponding one of the inductor wiring lines 20 toward the main face MF. The second vertical wiring line 72 is exposed from the main face MF. Note that, as in this embodiment, a face of each of the first vertical wiring lines 71 and a face of the second vertical wiring line 72, the faces exposed from the main face MF, may have at least a part covered with the corresponding one of the first external terminals 81 or the second external terminal 82.

Each of the four terminals 80 is exposed upward from the main face MF in the thickness direction Td. When viewed in the thickness direction Td, the outer edge of each of the four terminals 80 is arranged within the main face MF. In other words, the first external terminals 81, the second external terminal 82, and the dummy portion 83 are exposed out of the element body BD, only from the main face MF of the element body BD.

The element body BD has a first side face 93 that is perpendicular to the main face MF. Note that, the first side face 91 of the first layer L1 corresponds to a part of the first side face 93 of the element body BD. The element body BD also has a second side face 94 that is perpendicular to the main face MF and is parallel to the first side face 93. Note that, the second side face 92 of the first layer L1 corresponds to a part of the second side face 94 of the element body BD. In other words, each of the first support wiring lines 41 extends in parallel with the main face MF from the inductor wiring line 20, and has an end portion exposed to the first side face 93 of the element body BD. Similarly, the second support wiring line 42 extends in parallel with the main face MF from the corresponding one of the inductor wiring lines 20, and has an end portion exposed to the second side face 94 of the element body BD.

In this embodiment, the geometric center G of the fifth layer L5 is aligned with a geometric center of the main face MF. Further, when viewed in the thickness direction Td, the geometric center of the main face MF is aligned with a geometric center of the element body BD.

As illustrated in FIG. 3, the virtual straight line BX, passing through the geometric center G of the main face MF and extending in parallel with one side of the main face MF in the width direction Wd, is assumed to virtually divide the main face MF into a first region and a second region. When a region closer to the first end side in the length direction Ld with respect to the virtual straight line BX is referred to as the first region, the first region does not include the dummy portion 83. When a region closer to the second end side in the length direction Ld with respect to the virtual straight line BX is referred to as the second region, the second region includes the dummy portion 83, the number of which is equal to the number of the second external terminal 82.

Next, each of the wiring lines will be described in detail.

As illustrated in FIG. 3, when viewed in the thickness direction Td, the first wiring line body 21R has a central axis C1 extending in the length direction Ld. Note that, the central axis C1 of the first wiring line body 21R corresponds to a line following an intermediate point of the first wiring line body 21R in a direction orthogonal to a direction where the first wiring line body 21R extends, in other words, in the width direction Wd. Each of the wiring line body 21L and the wiring line body 21R has a line width (i.e., a dimension in the width direction Wd) of 50 micrometers.

As has been described above, the central axis C2 of the second wiring line body 21L of the second inductor wiring line 20L extends in the substantially L shape. Here, the long straight line portion 31 of the second wiring line body 21L is greater in wiring line length than the first wiring line body 21R. In addition, the second wiring line body 21L includes the connecting portion 33 and the short straight line portion 32. With this configuration, the second wiring line body 21L is greater in wiring line length than the first wiring line body 21R. Specifically, the second wiring line body 21L is 1.2 times or more greater in wiring line length than the first wiring line body 21R.

In accordance with the difference in wiring line length, the second inductor wiring line 20L is 10% or more greater in inductance value than the first inductor wiring line 20R. Specifically, the second inductor wiring line 20L has the inductance value of, for example, 3.3 nH. The first inductor wiring line 20R has the inductance value of, for example, 2.5 nH. Further, each of the first inductor wiring line 20R and the second inductor wiring line 20L has DC resistance of from 1 mΩ or more to 25 mΩ or less (i.e., from 1 mΩ to 25 mΩ). Note that, in this embodiment, the inductance value of the first inductor wiring line 20R is minimum among those of a plurality of the inductor wiring lines 20.

The first wiring line body 21R of the first inductor wiring line 20R extends along one side of an outer edge of the element body BD in the length direction Ld. When viewed in the thickness direction Td, the first pad 22L of the second inductor wiring line 20L and the second pad 23R are arranged symmetrically with respect to the geometric center of the element body BD. In this embodiment, the first pad 22L of the second inductor wiring line 20L and the second pad 23R are arranged doubly symmetrically with respect to the geometric center G.

The first inductor wiring line 20R has a parallel portion extending in parallel with a parallel portion that the second inductor wiring line 20L has. Specifically, each of the first wiring line body 21R and the long straight line portion 31 of the second wiring line body 21L corresponds to the parallel portion. The first wiring line body 21R and the long straight line portion 31 are arranged and aligned in the width direction Wd on the first layer L1. Note that, as long as the parallel portions are substantially parallel with each other, manufacturing deviation is tolerated.

The central axis C1 of the first wiring line body 21R and the central axis C2 of the long straight line portion 31 of the second wiring line body 21L have a distance therebetween in the width direction Wd, and in the descriptions below, the distance is referred to as a pitch X1 between the wiring line bodies. The pitch between the wiring line bodies corresponds to a pitch between the parallel portions adjoining each other. Further, the parallel portions of the inductor wiring lines adjoining each other have a distance therebetween, in other words, a distance between the first wiring line body 21R closer to the first end in the width direction and the long straight line portion 31 of the second wiring line body 21L closer to the second end side in the width direction, and the distance corresponds to, for example, approximately 200 micrometers.

As illustrated in FIG. 3, a distance from the central axis C1 of the first wiring line body 21R to an end of the element body in the width direction Wd, the end closer to the first wiring line body 21R (i.e., an end of the element body, the end closest to the second end in the width direction Wd) is referred to as a first distance Y1. A distance from the central axis C2 of the long straight line portion 31, which is the parallel portion of the second inductor wiring line 20L, to an end of the element body BD in the width direction Wd, the end closest to the long straight line portion 31 (i.e., an end of the element body BD, the end closer to the first end in the width direction Wd) is referred to as a second distance Y2. In this embodiment, the first distance Y1 is equal in dimension to the second distance Y2.

In the width direction Wd, the pitch X1 between the wiring line bodies is different in dimension from the first distance Y1 and the second distance Y2. Specifically, the pitch X1 between the wiring line bodies may be approximately "250 micrometers". The first distance Y1 and the second distance Y2 may be approximately "175 micrometers". As has been described above, each of the first distance Y1 and the second distance Y2 is preferably slightly greater than half of the pitch X1.

When viewed in the thickness direction Td, the one of the first support wiring lines 41, connected to the first pad 22R of the first inductor wiring line 20R, has a central axis A1 extending in the length direction Ld. The central axis A1 of the one of the first support wiring lines 41 is located more outward in the width direction Wd than the central axis C1 of the first wiring line body 21R. In other words, the central axis A1 of the one of the first support wiring lines 41 connected to the first inductor wiring line 20R has an extended line that is not aligned with the central axis C1 of the first wiring line body 21R. Thus, the central axis A1 of one of the first support wiring lines 41 is located on a straight line different from the central axis C1 of the first wiring line body 21R. Concurrently, the extended line of the central axis A1 of the one of the first support wiring lines 41 crosses the central axis CV1 of the one of the first vertical wiring lines 71.

The other of the first support wiring lines 41, connected to the first pad 22L of the second inductor wiring line 20L, has a central axis A1 extending in the length direction Ld. The central axis A1 of the other of the first support wiring lines 41 is located more outward in the width direction Wd than the central axis C2 of the second wiring line body 21L, more specifically, the central axis C2 of the long straight line portion 31. In other words, the central axis A1 of the other of the first support wiring lines 41 connected to the second inductor wiring line 20L has an extended line that is not aligned with the central axis C2 of the second wiring line body 21L. Thus, the central axis A1 of the other of the first support wiring lines 41 is located on a straight line different from the central axis C2 of the second wiring line body 21L. Concurrently, the extended line of the central axis A1 of the one of the first support wiring lines 41 crosses the central axis CV1 of the one of the first vertical wiring lines 71. Note that, the one of the first support wiring lines 41 (connected to the first inductor wiring line 20R) and the other of the first support wiring lines 41 (connected to the second inductor wiring line 20L) are arranged line-symmetrically with respect to the symmetrical axis AX.

When viewed in the thickness direction Td, the second support wiring line 42 has a central axis A2 extending in the length direction Ld. The central axis A2 of the second support wiring line 42 is located more outward in the width direction Wd than the central axis C1 of the first wiring line body 21R. In other words, the central axis A2 of the second support wiring line 42 has an extended line that is not aligned with the central axis C1 of the first wiring line body 21R. Thus, the central axis A2 of the second support wiring line 42 is located on a straight line different from the central axis C1 of the first wiring line body 21R. On the extended line of the central axis A2 of the second support wiring line 42, the second vertical wiring line 72 is arranged. Then, the extended line of the central axis A2 of the second support wiring line 42 crosses the central axis CV2 of the second vertical wiring line 72.

The one of the first support wiring lines 41 and the second support wiring line 42, each extending from the first inductor wiring line 20R, are arranged at the same position in the width direction Wd. In other words, the central axis A1 of one of the first support wiring lines 41 and the central axis A2 of the second support wiring line 42 are located on the same straight line. Note that, in this application, when a deviation between the central axis A1 and the central axis A2 is within 10% of a minimum line width of each of the first inductor wiring line 20R and the second inductor wiring line 20L, the central axis A1 and the central axis A2 are considered to be located on the same straight line. Specifically, in this embodiment, the minimum line width of each of the inductor wiring lines 20 corresponds to 50 micrometers, which is equal to the line width of the first wiring line body 21R and the line width of the second wiring line body 21L. Accordingly, in this embodiment, "located on the same straight line" corresponds to a case where a shortest distance between the central axis A1 and the central axis A2 is within 5 micrometers, and "located on different straight lines" corresponds to a case where the shortest distance exceeds 5 micrometers.

As has been described above, in the first layer L1, the first support wiring lines 41 are arranged line-symmetrically with respect to the symmetrical axis AX. Accordingly, as illustrated in FIG. 3, a distance Q1 is equal to a distance Q2. Here, the distance Q1 corresponds to a distance between the end of the element body BD closer to the second end in the width direction Wd and the central axis A1 of the one of the support wiring lines 41 extending from the first inductor wiring line 20R; and the distance Q2 corresponds to a distance between the end of the element body BD closer to the first end in the width direction Wd and the central axis A1 of the other of the support wiring lines 41 extending from the second inductor wiring line 20L.

On the other hand, in the width direction Wd, a pitch P1 is greater than each of the distance Q1 and the distance Q2. Here, the pitch P1 corresponds to a pitch between the central axis A1 of the one of the first support wiring lines 41 extending from the first inductor wiring line 20R and the central axis A1 of the other of the first support wiring lines 41 extending from the second inductor wiring line 20L. Specifically, the pitch P1 is approximately twice as great as each of the distance Q1 and the distance Q2.

Figure 5:
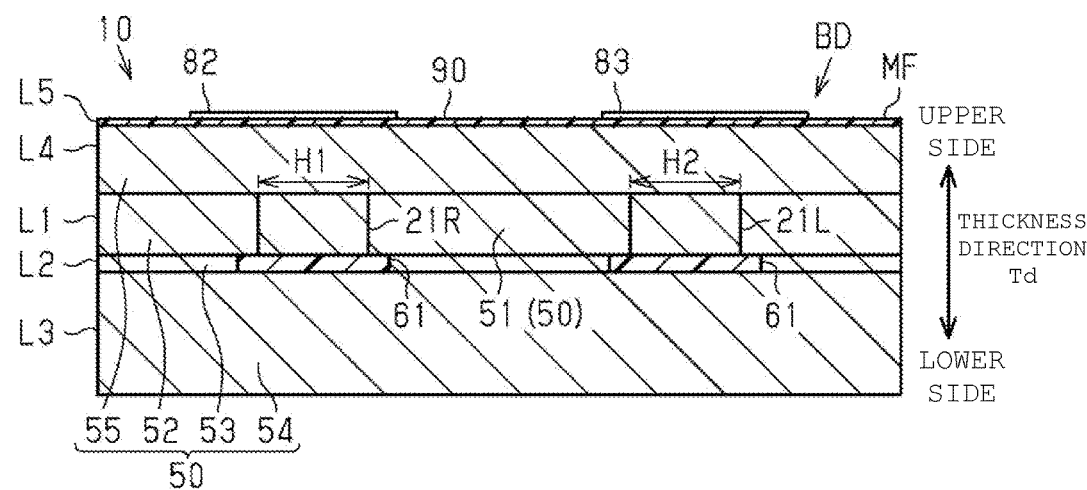
FIG. 5 is a sectional view of the inductor component taken along line 5-5 in FIG. 3.

As illustrated in FIG. 5, in the width direction Wd, the first wiring line body 21R has a wiring line width H1 equal to a wiring line width H2 that the second wiring line body 21L has. Note that, in this application, when a deviation in sectional area between the first wiring line body 21R and the second wiring line body 21L is within 10%, the wiring line width H1 and the wiring line width H2 are considered to be equal.

Further, the first inductor wiring line 20R and the second inductor wiring line 20L are arranged in the first layer L1 as a shared layer, so that in the thickness direction Td, the first wiring line body 21R has a dimension equal to a dimension that the second wiring line body 21L has. Thus, the first wiring line body 21R has a sectional area orthogonal to the central axis C1 of the first wiring line body 21R, the sectional area equal to a sectional area that the second wiring line body 21L has.

Figure 6:
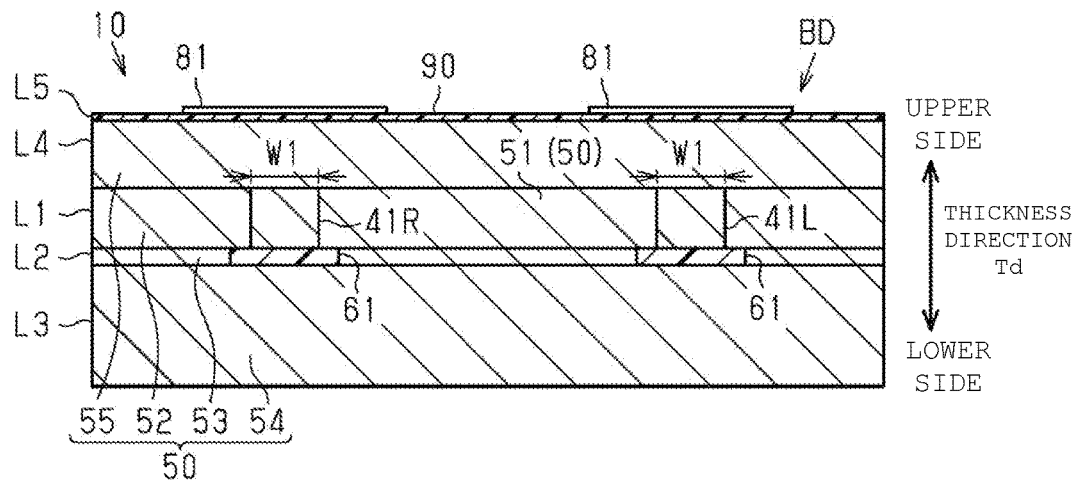
FIG. 6 is a sectional view of the inductor component taken along line 6-6 in FIG. 3.

As illustrated in FIG. 5 and FIG. 6, in the width direction Wd, each of the first support wiring lines 41 has a wiring line width W1 smaller than the wiring line width H1 of the first wiring line body 21R. Here, each of the first support wiring lines 41 and the first wiring line body 21R are provided in the first layer L1 as a shared layer. Thus, in the thickness direction Td, each of the support wiring lines 41 has a dimension substantially equal to the dimension of the first wiring line body 21R. In accordance with the difference in the wiring line width, each of the first support wiring lines 41 has a sectional area smaller than the sectional area of the first wiring line body 21R.

Similarly, as illustrated in FIGS. 3 and 6, in the width direction Wd, the second support wiring line 42 has a wiring line width W2 smaller than the wiring line width H1 of the first wiring line body 21R. In accordance with the difference in the wiring line width, the second support wiring line 42 has a sectional area smaller than the sectional area of the first wiring line body 21R.

Figure 7:
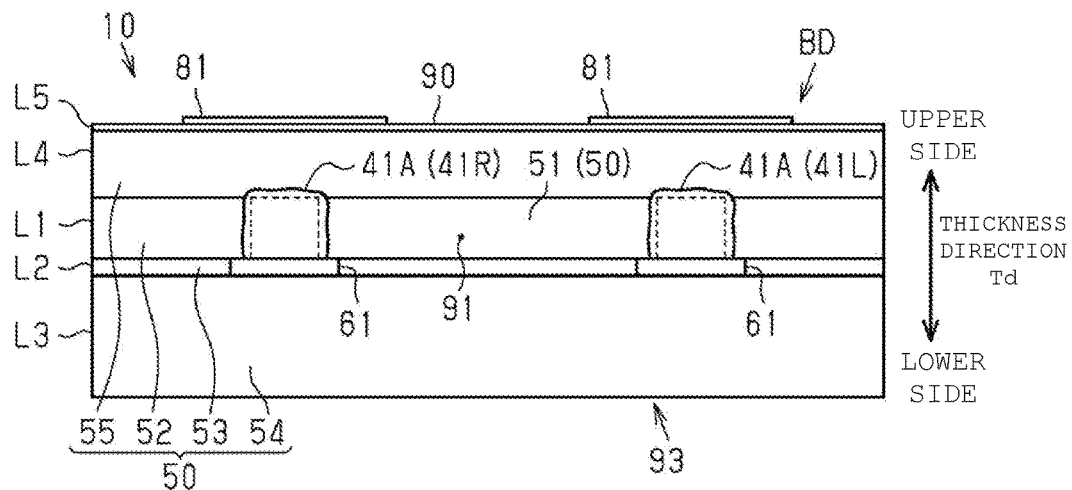
FIG. 7 is a side view illustrating a first side face of the inductor component.

As illustrated in FIG. 7, each of the first support wiring lines 41 has an end exposed to the first side face 93 of the element body, the end BD closer to the first end in the length direction Ld. Each of the first support wiring lines 41 has the exposed face 41A exposed to the first side face 93, and has a sectional shape orthogonal to the central axis A1; and the exposed face 41A has a shape where the sectional shape of each of the first support wiring lines 41 is slightly extended in the width direction Wd. Consequently, the exposed face 41A of each of the first support wiring lines 41 has an area greater than the sectional area of the corresponding first support wiring line 41 inside the element body BD, the sectional area orthogonal to the central axis A1. Similarly, as illustrated in FIG. 2, the second support wiring line 42 is exposed to the second side face 94 of the element body BD closer to the second end in the length direction Ld. The second support wiring line 42 has the exposed face 42A exposed to the second side face 94; and the exposed face 42A has an area greater than the sectional area of the second support wiring line 42 inside the element body BD, the sectional area orthogonal to the central axis A2. With this configuration, each of the first support wiring lines 41 has an increased contact area with the first side face 93 of the element body BD, and the second support wiring line 42 has an increased contact area with the second side face 94 of the element body BD. Consequently, the first support wiring lines 41 and the second support wiring line 42 are brought into closer contact with the element body BD. Note that, as long as each of the sectional areas satisfies the large/small relationship described above, the exposed face 41A may be formed in, for example, a shape, one side of which is extended and the other side of which is covered with an extended portion of the element body BD.

Note that, the number of the first support wiring lines 41 exposed to the first side face 91 is two, and the number of the second support wiring line 42 exposed to the second side face 92 is one, so that the number of the support wiring lines exposed is different.

Next, a method for manufacturing the inductor component 10 will be described.

Figure 8:
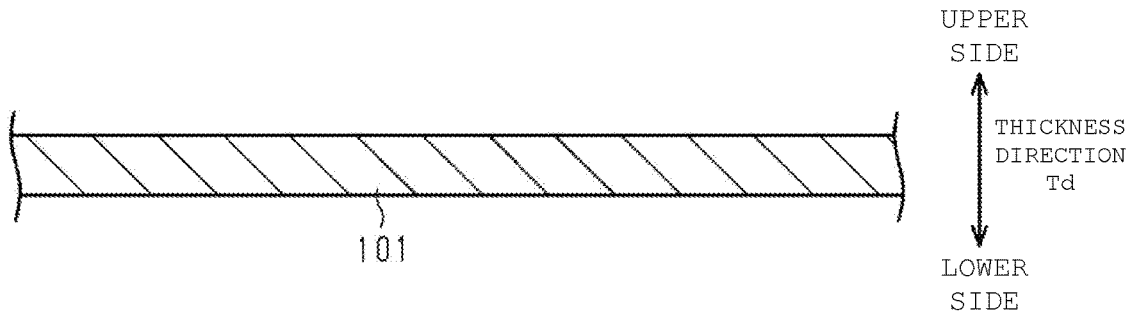
FIG. 8 illustrates a method for manufacturing the inductor component.

As illustrated in FIG. 8, first, a base member preparation process is conducted. Specifically, a base member 101 having a plate shape is prepared. The base member 101 is formed of a ceramic material. The base member 101 has a square shape when viewed in the thickness direction Td. In the square shape, each side has a dimension corresponding to a dimension within which a plurality of the inductor components 10 are accommodated. In the descriptions below, the base member 101 has a face direction orthogonal to the thickness direction Td.

Figure 9:
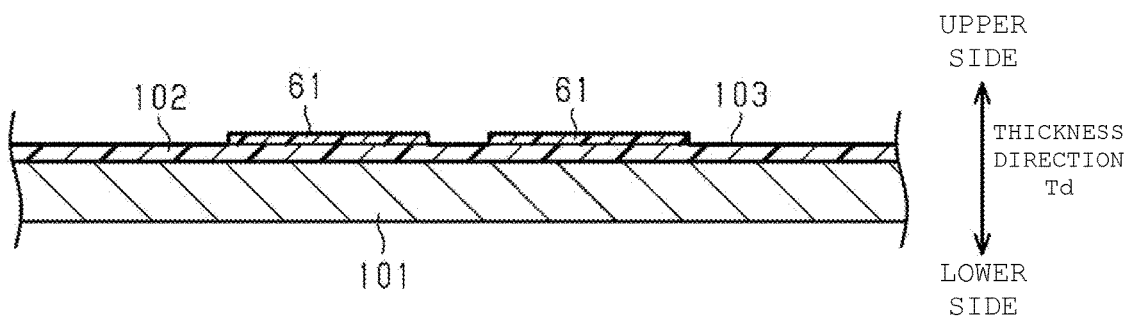
FIG. 9 illustrates a method for manufacturing the inductor component.

Next, as illustrated in FIG. 9, the base member 101 has an upper face, and has a dummy insulating layer 102 applied on an entire area of the upper face. Next, when viewed in the thickness direction Td, each of the insulating resin bands 61 is patterned by using a photolithography technique in a region slightly greater than the region where the first inductor wiring line 20R and the second inductor wiring line 20L are arranged.

Next, a seed layer formation process, where a seed layer 103 is formed, is conducted. Specifically, at the upper face side of the base member 101, the seed layer 103 of copper is formed by sputtering on an upper face of each of the insulating resin bands 61 and an upper face of the dummy insulating layer 102. In the drawings, the seed layer 103 is illustrated with bold line.

Figure 10:
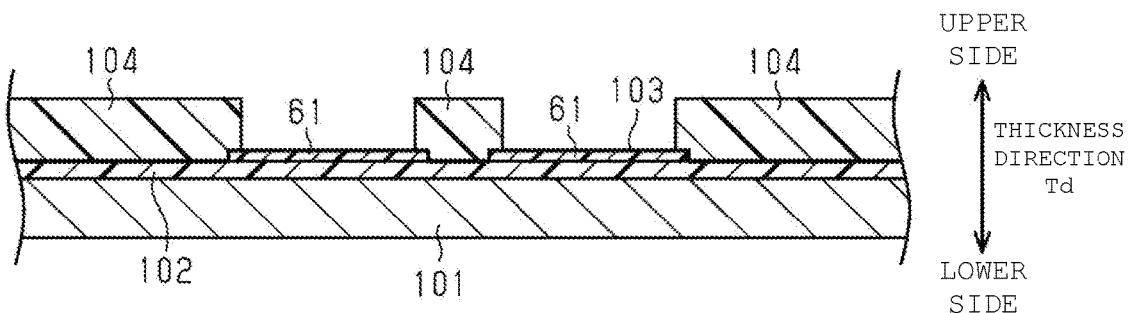
FIG. 10 illustrates a method for manufacturing the inductor component.

Next, as illustrated in FIG. 10, a first coating process is conducted. In the first coating process, the seed layer 103 has, on its upper face, a portion excluding the first inductor wiring line 20R, the second inductor wiring line 20L, the first support wiring lines 41, and the second support wiring line 42; and this portion is to be coated to form a first coating portion 104. Specifically, first, the seed layer 103 has photosensitive dry film resist applied on an entire area of the upper face thereof. Next, the entire area of the upper face of the dummy insulating layer 102 as well as a portion of the upper face of each of the insulating resin bands 61, i.e., an upper face of an outer edge of the region that a corresponding one of the insulating resin bands 61 covers, are exposed to be cured. Subsequently, a chemical solution is used to peel off and remove a portion where the dry film resist has been applied and is not yet cured. Consequently, a portion, where the dry film resist has been cured, is formed as the first coating portion 104. On the other hand, the portion, where the dry film resist has been applied and then has been removed by the chemical solution, is not coated with the first coating portion 104; and in this portion, the seed layer 103 is exposed. The first coating portion 104 has a thickness as a dimension in the thickness direction Td, the thickness slighter greater than a thickness of each of the first inductor wiring line 20R and the second inductor wiring line 20L in the inductor component 10 in FIG. 5. Note that, in other processes to be described later, the photolithography technique is used in a similar manner, and thus a detailed description thereof will be omitted.

Figure 11:
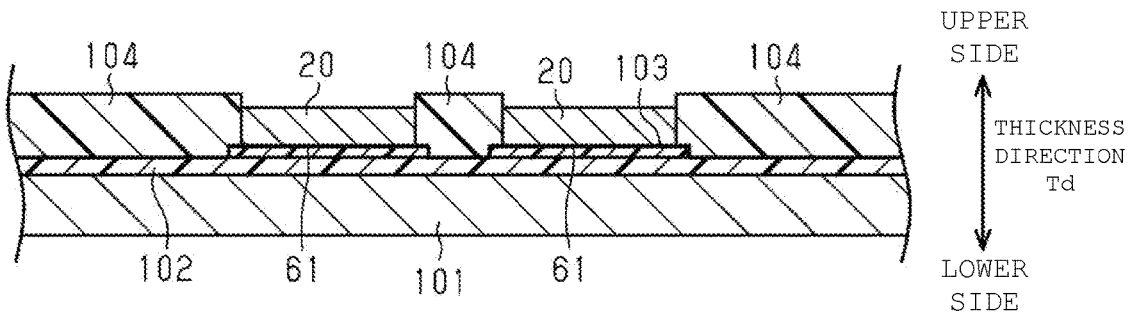
FIG. 11 illustrates a method for manufacturing the inductor component.

Next, as illustrated in FIG. 11, a wiring line processing process is conducted. In the wiring line processing process, each of the first inductor wiring line 20R, the second inductor wiring line 20L, the first support wiring lines 41, and the second support wiring line 42 is formed by electroless plating in the portion that is not coated with the first coating portion 104 on the upper face of each of the insulating resin bands 61. Specifically, copper electroplating is carried out such that, on the upper face of each of the insulating resin bands 61, copper is further plated in the portions where the seed layer 103 is exposed. Consequently, the first inductor wiring line 20R, the second inductor wiring line 20L, the first support wiring lines 41, and the second support wiring line 42 are formed thereon. Accordingly, in this embodiment, the inductor wiring lines 20 (provided in plurality) are formed in the same process as the process where the first support wiring lines 41 (provided in plurality) and the second support wiring line 42, each configured to connect the pads of the various inductor wiring lines, are formed. The inductor wiring lines 20, the first support wiring lines 41, and the second support wiring line 42 are formed on the same plane. Note that, in FIG. 11, the first inductor wiring line 20R and the second inductor wiring line 20L are illustrated, and the support wiring lines 41 and 42 are omitted.

Figure 12:
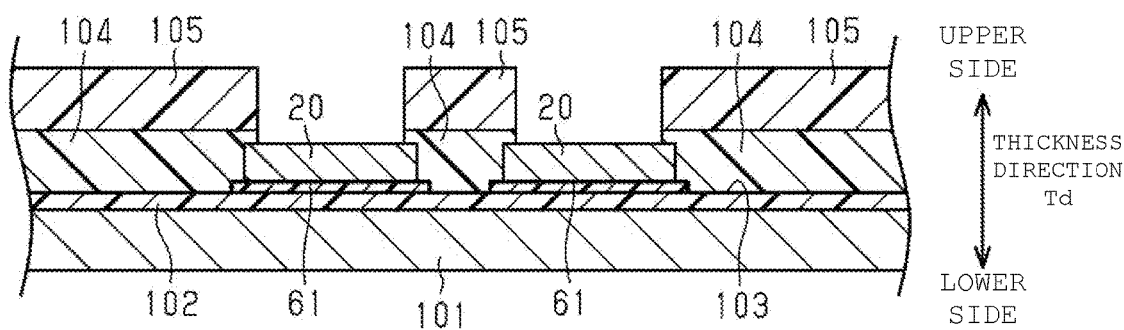
FIG. 12 illustrates a method for manufacturing the inductor component.

Next, as illustrated in FIG. 12, a second coating process, where a second coating portion 105 is formed, is conducted. The second coating portion 105 is formed in a region on each of an entire area of the first coating portion 104, entire areas of the upper faces of the first support wiring lines 41, an entire area of the upper face of the second support wiring line 42, and upper faces of the first inductor wiring line 20R and the second inductor wiring line 20L, the region excluding the first vertical wiring lines 71 and the second vertical wiring line 72. In the region described above, the second coating portion 105 is formed by using the photolithography technique as in a case where the first coating portion 104 has been formed. The second coating portion 105 has a dimension in the thickness direction Td, the dimension equal to that of the first coating portion 104.

Next, a vertical wiring line processing process, where each of the vertical wiring lines is formed, is conducted. Specifically, in a portion of the first inductor wiring line 20R and a portion of the second inductor wiring line 20L, the portions not coated with the second coating portion 105, the first vertical wiring lines 71 and the second vertical wiring line 72 are formed by copper electroplating. Consequently, the first vertical wiring lines 71 and the second vertical wiring line 72 are formed in the thickness direction Td perpendicular to the plane where the inductor wiring lines 20 (provided in plurality), the first support wiring lines 41, and the second support wiring line 42 are formed. In the vertical wiring line processing process, the copper plated further is set to have its upper end slightly lower than an upper face of the second coating portion 105. Specifically, each of the vertical wiring lines before a cutting process (as will be described later) has a dimension in the thickness direction Td, the dimension set to be equal to the dimension that each of the inductor wiring lines 20 has in the thickness direction Td.

Figure 13:
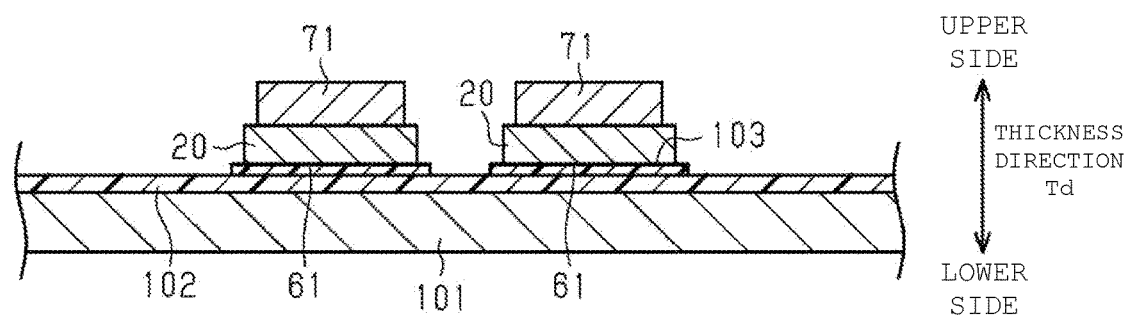
FIG. 13 illustrates a method for manufacturing the inductor component.

Next, as illustrated in FIG. 13, a coating portion removal process is conducted; in the coating portion removal process, each of the first coating portion 104 and the second coating portion 105 is removed. Specifically, each of the first coating portion 104 and the second coating portion 105 is wet-etched by a chemical to be peeled off. Note that, in FIG. 13, the first vertical wiring lines 71 are illustrated, and the second vertical wiring line 72 is omitted.

Next, a seed layer etching process, where the seed layer 103 is etched, is conducted. The seed layer 103 is etched such that the seed layer 103 exposed is removed. As has been described above, each of the inductor wiring lines 20, the support wiring lines 41, and the support wiring line 42 is formed in a semi-additive process (SAP).

Figure 14:
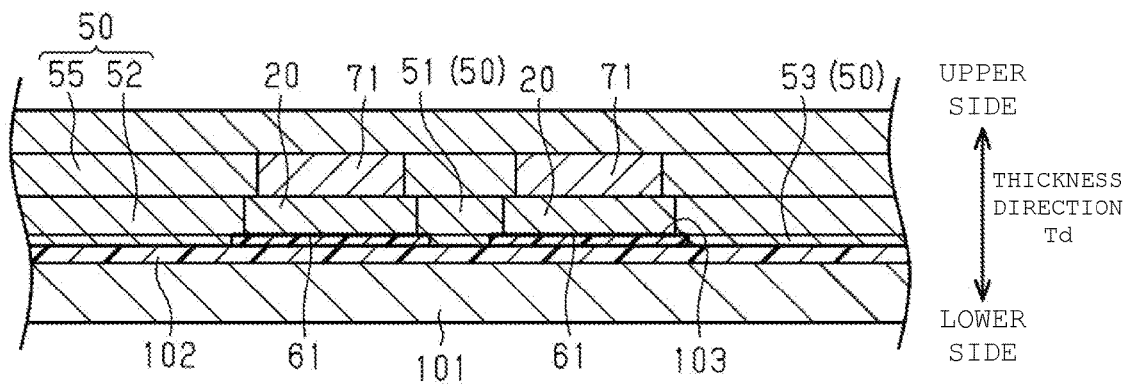
FIG. 14 illustrates a method for manufacturing the inductor component.

Next, as illustrated in FIG. 14, a second magnetic layer processing process is conducted; in the second magnetic layer processing process, the inner magnetic path 51, the outer magnetic path 52, the insulating resin magnetic layer 53, and the second magnetic layer 55 are laminated. Specifically, first, a resin material containing magnetic powder, the resin material of which the magnetic layer 50 is formed, is applied to the upper face of the base member 101. In this state, the resin material containing the magnetic powder is applied such that an upper face of each of the vertical wiring lines is also coated. Next, the resin material containing the magnetic powder is press-hardened such that the inner magnetic path 51, the outer magnetic path 52, the insulating resin magnetic layer 53, and the second magnetic layer 55 are formed on the upper face of the base member 101.

Figure 15:
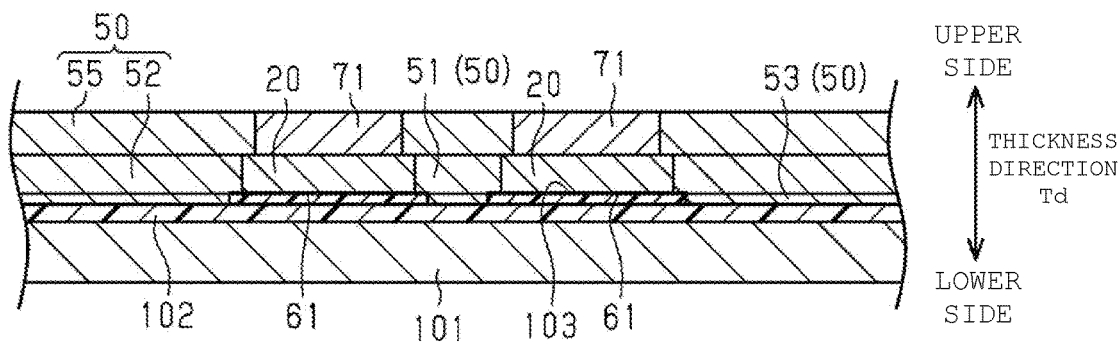
FIG. 15 illustrates a method for manufacturing the inductor component.

Next, as illustrated in FIG. 15, the upper face of the second magnetic layer 55 is cut off until the upper face of each of the vertical wiring lines is exposed. Note that, the inner magnetic path 51, the outer magnetic path 52, the insulating resin magnetic layer 53, and the second magnetic layer 55 are integrally formed, but in the drawings, the inner magnetic path 51, the outer magnetic path 52, the insulating resin magnetic layer 53, and the second magnetic layer 55 are illustrated separately.

Figure 16:
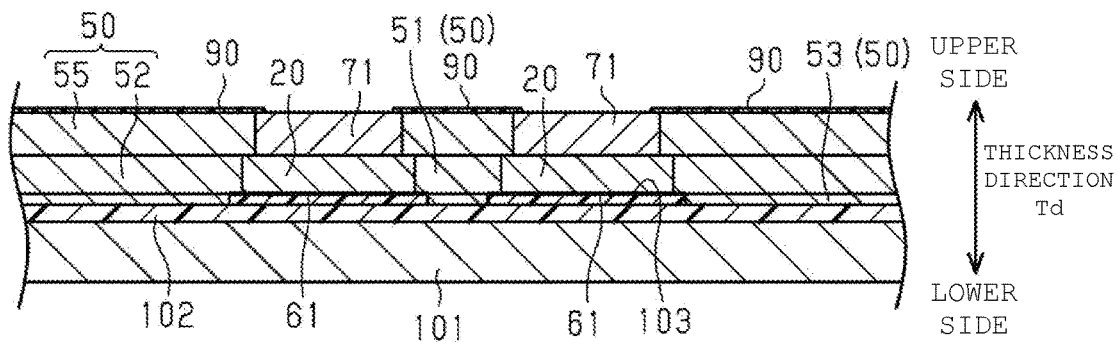
FIG. 16 illustrates a method for manufacturing the inductor component.

Next, as illustrated in FIG. 16, an insulating layer processing process is conducted. Specifically, the solder resist, which is to function as the insulating layer 90, is patterned by using the photolithography technique in a portion on the upper face of the second magnetic layer 55 and in a portion on the upper face of each of the vertical wiring lines, the portions excluding the four terminals 80. In this embodiment, an upper face of the insulating layer 90, in other words, a direction orthogonal to the main face MF of the element body BD, corresponds to the thickness direction Td.

Figure 17:
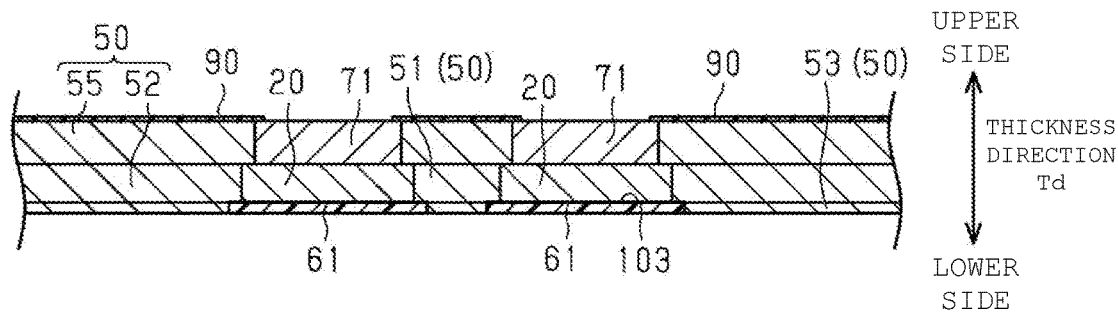
FIG. 17 illustrates a method for manufacturing the inductor component.

Next, as illustrated in FIG. 17, a base member cutting process is conducted. Specifically, the base member 101 and the dummy insulating layer 102 are cut off and removed altogether. Consequently, the dummy insulating layer 102 is to be cut off altogether, causing a part of a lower portion of each of the insulating resin bands to be removed. Note that each of the inductor wiring lines 20 is not removed here.

Figure 18:
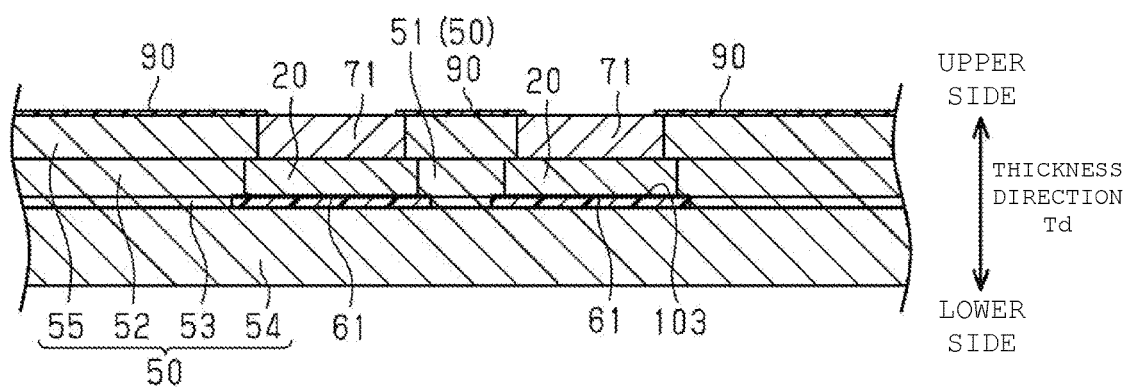
FIG. 18 illustrates a method for manufacturing the inductor component.

Next, as illustrated in FIG. 18, a first magnetic layer processing process, where the first magnetic layer 54 is laminated, is conducted. Specifically, first, the resin material containing the magnetic powder, the resin material of which the first magnetic layer 54 is formed, is applied to a lower face of the base member 101. Next, the resin material containing the magnetic powder is press-hardened such that the first magnetic layer 54 is formed on the lower face of the base member 101.

Next, a lower end portion of the first magnetic layer 54 is cut off. The lower end portion of the first magnetic layer 54 is cut off such that, for example, a dimension from an upper face of each of the external terminals to a lower face of the first magnetic layer 54 shows a desired value.

Figure 19:
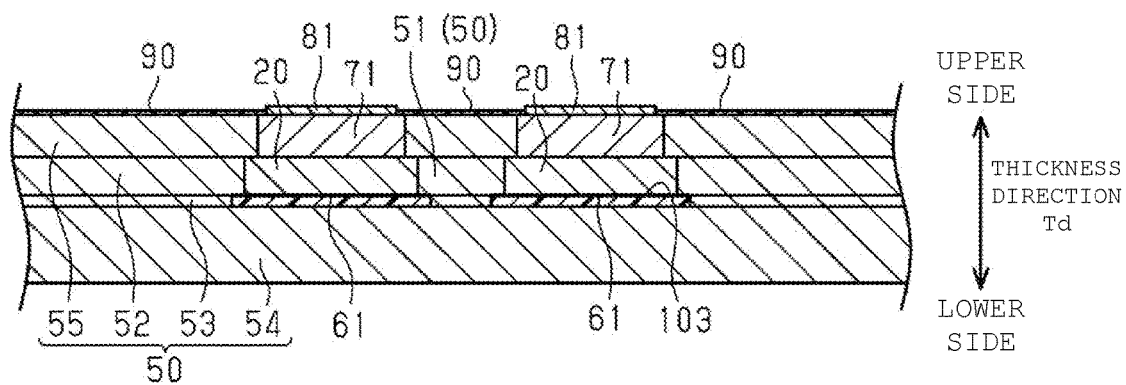
FIG. 19 illustrates a method for manufacturing the inductor component.

Next, as illustrated in FIG. 19, a terminal processing process is conducted. Specifically, each of the first external terminals 81, the second external terminal 82, and the dummy portion 83 is formed in a portion on the upper face of the second magnetic layer 55 or a portion on the upper face of each of the vertical wiring lines, the portions not coated with the insulating layer 90. These metal layers are formed by electroless plating of each of copper, nickel, and gold. Further, the metal layers may include a catalyst layer, such as palladium, between the copper and the nickel. Consequently, the first external terminals 81, the second external terminal 82, and the dummy portion 83 are formed in the three-layer configuration. Note that, in FIG. 19, the first external terminals 81 are illustrated, and the second external terminal 82 and the dummy portion 83 are omitted.

Figure 20:
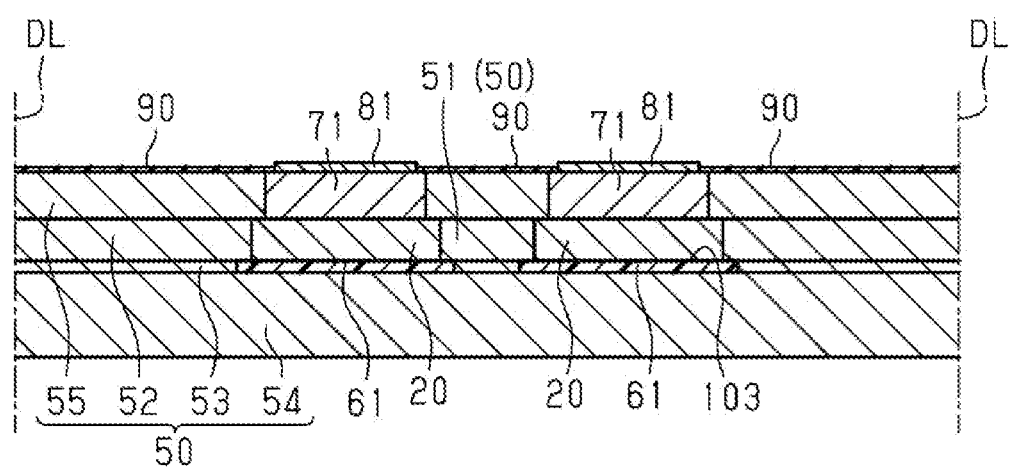
FIG. 20 illustrates a method for manufacturing the inductor component.

Next, as illustrated in FIG. 20, a dividing processing process is conducted. The dividing process corresponds, specifically, to cutting with a dicing machine along a break line DL. This process results in obtaining the inductor component 10.

Figure 21:
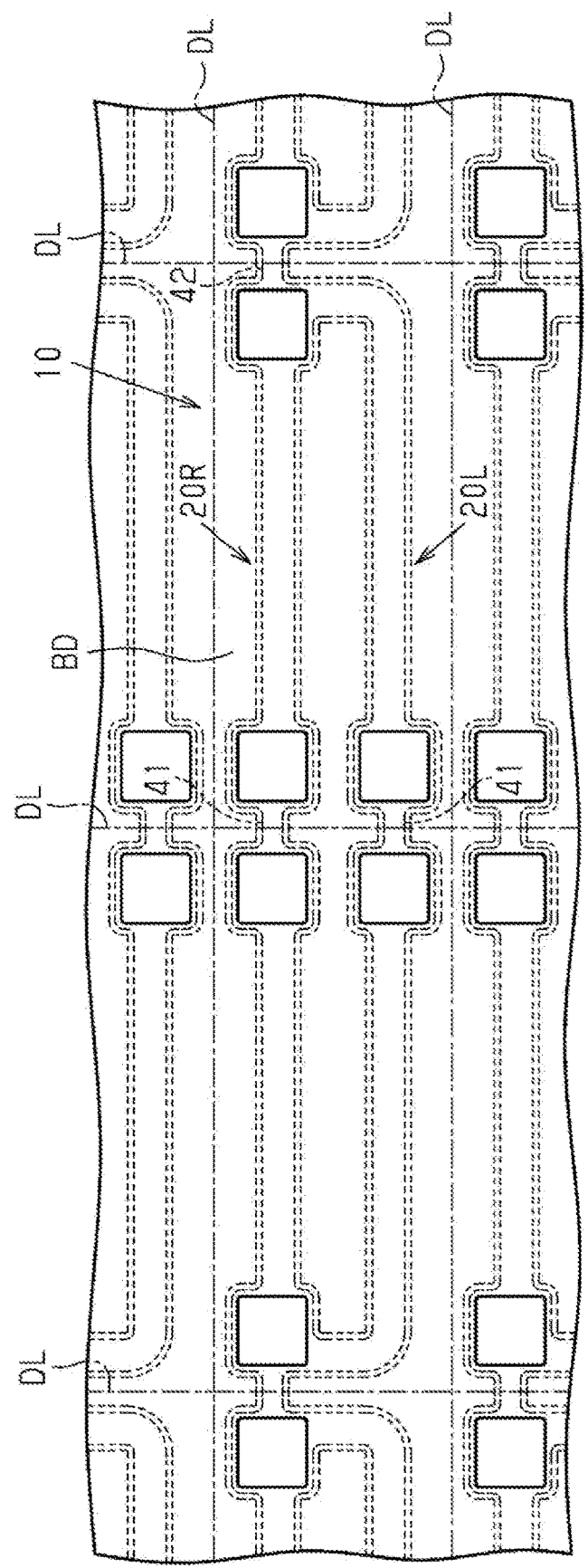
FIG. 21 illustrates a method for manufacturing the inductor component.

In a state before subjected to the dicing machine, for example, as illustrated in FIG. 21, the plurality of inductor components are arranged and aligned in the length direction Ld and in the width direction Wd; and the plurality of inductor components are connected via the element bodies BD, the first support wiring lines 41, and the second support wiring line 42. Specifically, the first support wiring lines 41 are connected with each other, and the second support wiring lines 42 are connected with each other. The first support wiring lines 41 and the second support wiring lines 42 included in the break line DL are cut in the thickness direction Td, so that each of the first support wiring lines 41 has its cut face exposed to the first side face 93 as the exposed face 93A. The second support wiring line 42 has its cut face exposed to the second side face 94 as the exposed face 42A. Note that, in FIG. 21, the fifth layer L5 is omitted.

When the dividing processing process has been conducted, each of the inductor components 10 is left for a certain period of time in the presence of oxygen. Consequently, in each of the inductor components 10, a portion including the exposed face 41A of each of the first support wiring lines 41 and a portion including the exposed face 42A of the second support wiring line 42 are oxidized to form a Cu oxide.

Next, a configuration of the DC/DC converter component 300, which includes the inductor component 10 described above, will be described.

The DC/DC converter component 300 includes the inductor component 10, a semiconductor integrated circuit 310, and a package substrate 350. In the inductor component 10 having the configuration as above, one of the first external terminals 81, which is connected to the first inductor wiring line 20R, is connected to the first end of the first switching element 321. In other words, the one of the first external terminals 81, which is connected to the first inductor wiring line 20R, functions as the first terminal 80A. The other of the first external terminals 81, which is connected to the second inductor wiring line 20L, is connected to the first end of the second switching element 322. In other words, the other of the first external terminals 81, which is connected to the second inductor wiring line 20L, functions as the second terminal 80B. The second external terminal 82 is connected to the first end of the third switching element 323. In other words, the second external terminal 82 functions as the third terminal 80C.

The semiconductor integrated circuit 310 includes a switch circuit 320, the control circuit 330, and the ammeter 340. The switch circuit 320 includes the switching elements 321 to 326, and the ammeter 340 is configured to detect the direct current flowing to the microprocessor 500. The semiconductor integrated circuit 310 corresponds to a single-chip system including the switch circuit 320, the control circuit 330, the ammeter 340, and peripheral circuits thereof. The semiconductor integrated circuit 310 is a rectangular chip in plan view. The semiconductor integrated circuit 310 has a dimension in the length direction Ld and a dimension in the width direction Wd, each of the dimensions greater than a dimension that the inductor component 10 has in each of the length direction Ld and the width direction Wd.

Figure 22:
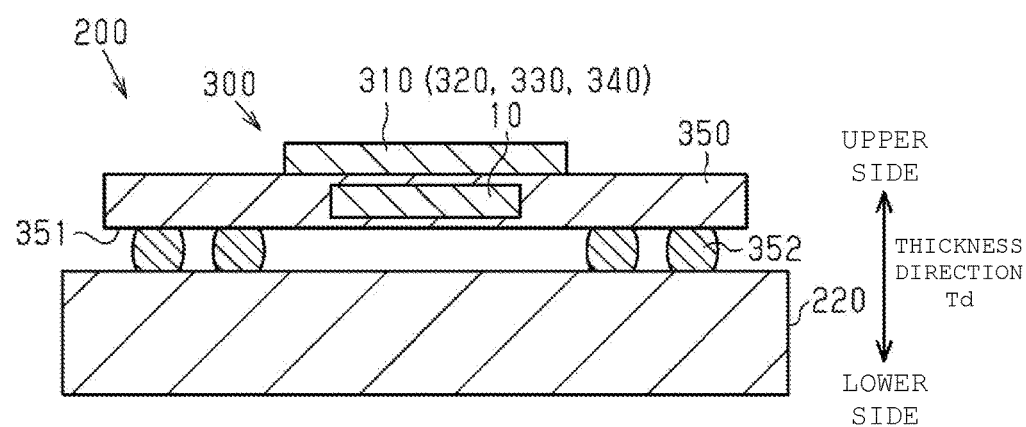
FIG. 22 is a schematic diagram of the electronic device including the DC/DC converter component according to the embodiment.

As illustrated in FIG. 22, the package substrate 350 has a plate shape. While not illustrated, the package substrate 350 is formed of an insulating material and includes wiring lines and terminals therein and thereon.

The package substrate 350 has a face at one side of the thickness direction Td, the face corresponding to a mounting face 351 that is to be mounted to other substrate, i.e., a motherboard 220 in this embodiment. The package substrate 350 has a face opposite the mounting face 351, the face to which the semiconductor integrated circuit 310 is mounted. The package substrate 350 has the inductor component 10 installed therein. In this embodiment, the inductor component 10 is wholly embedded in the package substrate 350. The main face MF of the inductor component 10 is located in parallel with the mounting face 351 of the package substrate 350.

Figure 23:
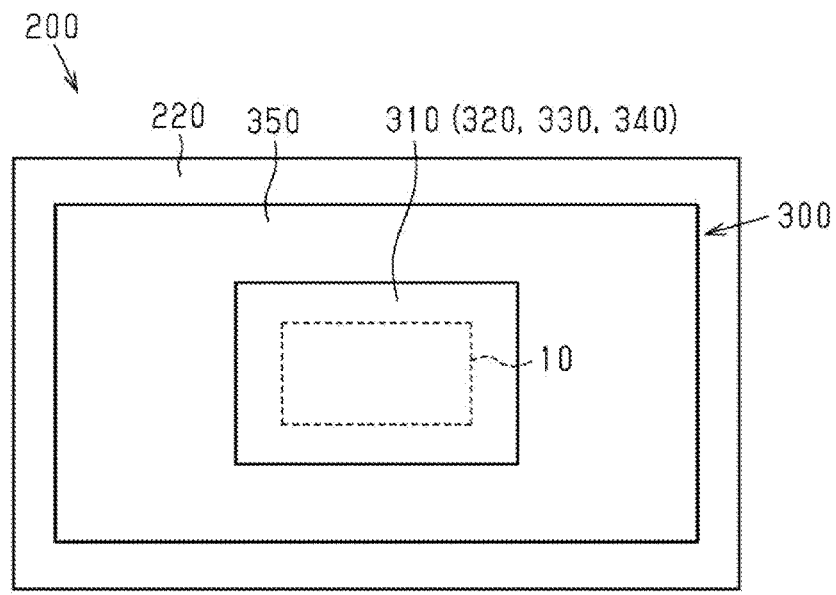
FIG. 23 is a schematic diagram of the electronic device including the DC/DC converter component according to the embodiment.

As illustrated in FIG. 23, when viewed in the thickness direction Td orthogonal to the mounting face 351, the inductor component 10 is located to overlap the semiconductor integrated circuit 310. Further, when viewed in the thickness direction Td, the inductor component 10 is arranged to be wholly located within the semiconductor integrated circuit 310.

As illustrated in FIG. 22, the DC/DC converter component 300, having the configuration as has been described above, is mounted to the motherboard 220 in the electronic device 200. Specifically, in the DC/DC converter component 300, the package substrate 350 has a solder 352 mounted to the mounting face 351, the solder 352 configured to connect the package substrate 350 to the motherboard 220. The package substrate 350 of the DC/DC converter component 300 and the motherboard 220 are fixed with the solder 352 interposed therebetween, and the package substrate 350 is electrically connected to wiring lines or others of the motherboard 220.

Next, an operating state of the DC/DC converter component 300 will be described. In this embodiment, based on the current value detected by the ammeter 340, the control circuit 330 controls each of the switching elements 321 to 326 between the on-state and the off-state in the switch circuit 320, so as to switch a state of the switch circuit 320.

Figure 24:
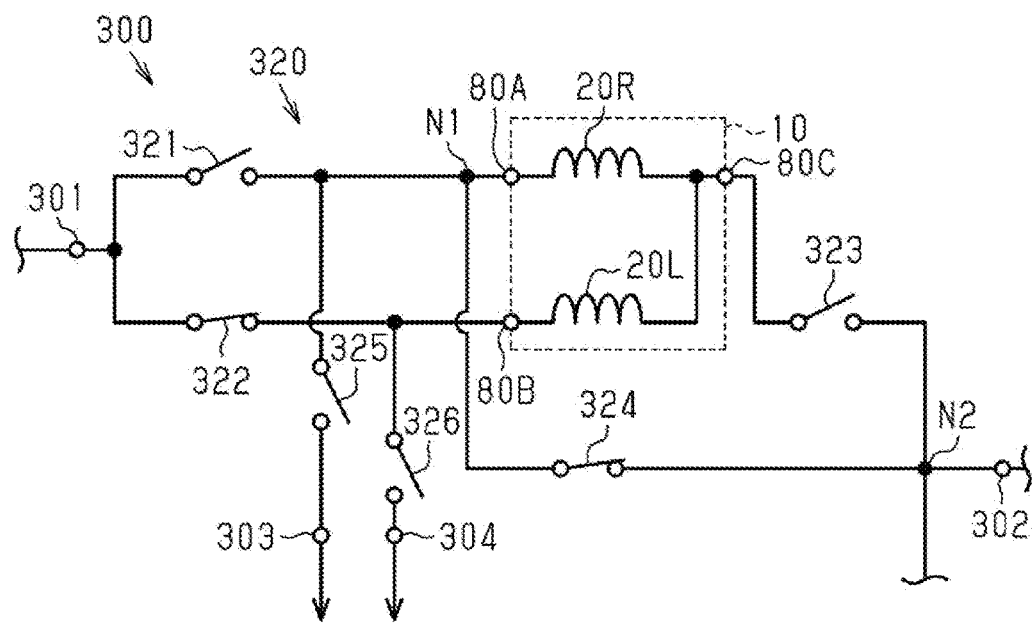
FIG. 24 illustrates an operating state of the DC/DC converter component according to the embodiment.

As illustrated in FIG. 24, when the current value detected by the ammeter 340 is smaller than a first predetermined value predetermined, the control circuit 330 switches the switch circuit 320 to a first circuit state. When the switch circuit 320 is in the first circuit state, the first switching element 321 is in the off-state, the third switching element 323 is in the off-state, and the fourth switching element 324 is in the on-state, so that the first inductor wiring line 20R and the second inductor wiring line 20L are connected in series. The control circuit 330 repeatedly switches the second switching element 322 between the on-state and the off-state, so as to control the current flowing through the first inductor wiring line 20R and the second inductor wiring line 20L connected in series. When the second switching element 322 is in the on-state, in a state where the first terminal 80A is connected to the output terminal 302, the second terminal 80B is connected to the input terminal 301. With this configuration, in the switch circuit 320, the first inductor wiring line 20R and the second inductor wiring line 20L, which are connected in series, are in the on-state as connected to between the input terminal 301 and the output terminal 302. On the other hand, when the second switching element 322 is in the off-state, the sixth switching element 326 is in the on-state, so that the second terminal 80B is connected to the second grounding terminal 304. With this configuration, in the switch circuit 320, the first inductor wiring line 20R and the second inductor wiring line 20L, which are connected in series, are in the off-state as connected to between the second grounding terminal 304 and the output terminal 302. In the first circuit state, the first inductor wiring line 20R and the second inductor wiring line 20L, which are connected in series, are switched between the on-state and the off-state as has been described above, so that the power supply voltage is stepped down to be supplied to the load.

Figure 25:
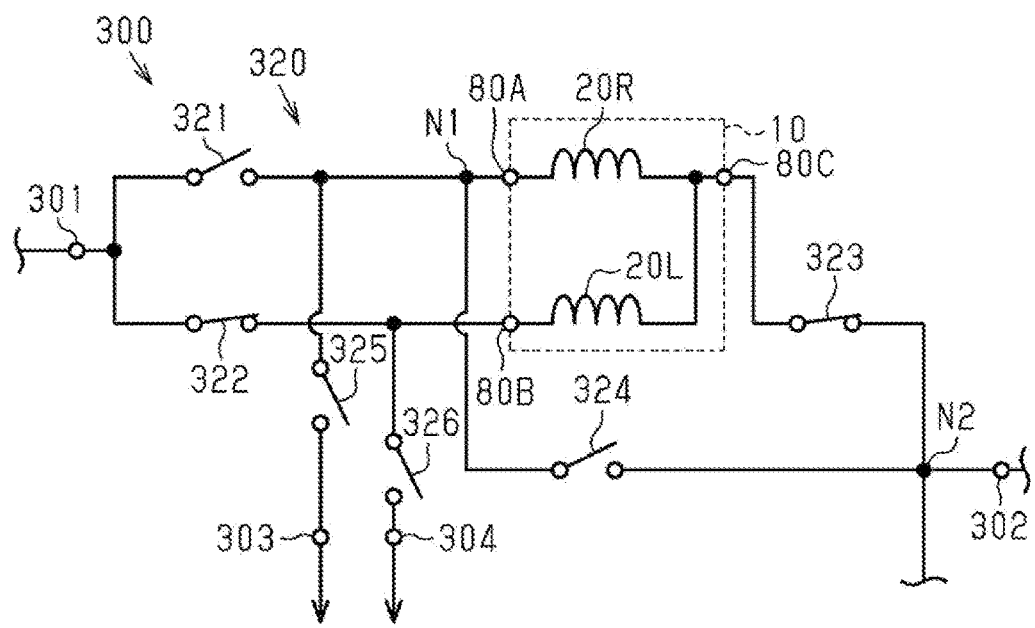
FIG. 25 illustrates an operating state of the DC/DC converter component according to the embodiment.

As illustrated in FIG. 25, when the current value detected by the ammeter 340 is equal to or greater than the first predetermined value and concurrently, is smaller than a second predetermined value that is predetermined as greater than the first predetermined value, the control circuit 330 switches the switch circuit 320 to a second circuit state for only the second inductor wiring line 20L. When the switch circuit 320 is in the second circuit state for only the second inductor wiring line 20L, the first switching element 321 is in the off-state, the third switching element 323 is in the on-state, and the fourth switching element 324 is in the off-state. The control circuit 330 repeatedly switches the second switching element 322 between the on-state and the off-state, so as to control the current flowing through the second inductor wiring line 20L. When the second switching element 322 is in the on-state, in a state where the third terminal 80C is connected to the output terminal 302, the second terminal 80B is connected to the input terminal 301. With this configuration, in the switch circuit 320, only the second inductor wiring line 20L is in the on-state as connected to between the input terminal 301 and the output terminal 302. On the other hand, when the second switching element 322 is in the off-state, the sixth switching element 326 is in the on-state, so that the second terminal 80B is connected to the second grounding terminal 304. With this configuration, in the switch circuit 320, only the second inductor wiring line 20L is in the off-state as connected to between the second grounding terminal 304 and the output terminal 302. In the second circuit state for only the second inductor wiring line 20L, only the second inductor wiring line 20L is switched between the on-state and the off-state as has been described above, so that the power supply voltage is stepped down to be supplied to the load.

Figure 26:
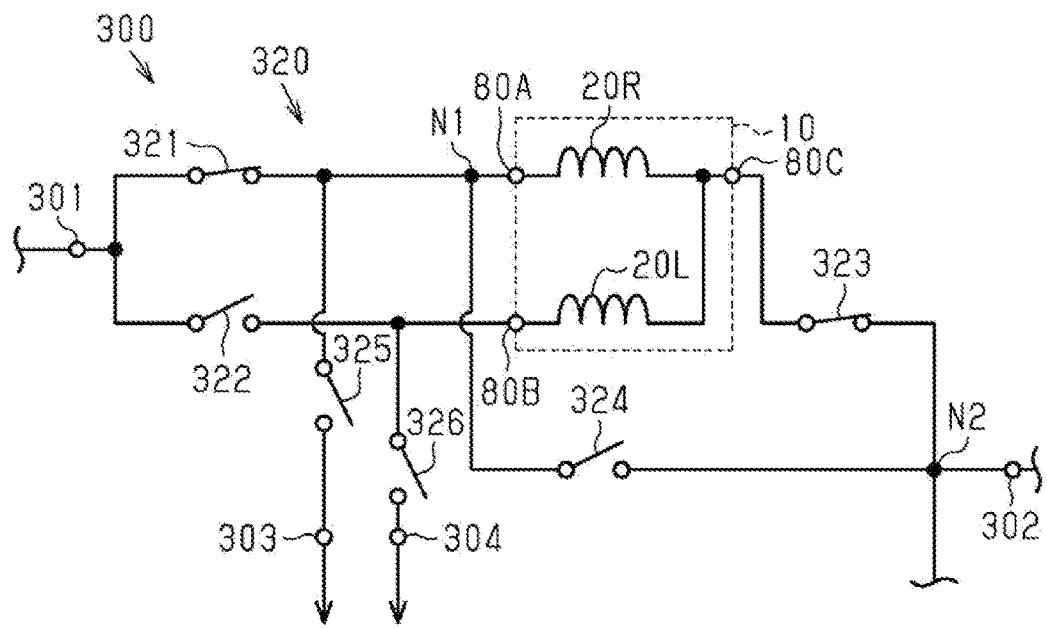
FIG. 26 illustrates an operating state of the DC/DC converter component according to the embodiment.

As illustrated in FIG. 26, when the current value detected by the ammeter 340 is equal to or greater than the second predetermined value and concurrently, is smaller than a third predetermined value that is predetermined as greater than the second predetermined value, the control circuit 330 switches the switch circuit 320 to a second circuit state for only the first inductor wiring line 20R. When the switch circuit 320 is in the second circuit state for only the first inductor wiring line 20R, the second switching element 322 is in the off-state, the third switching element 323 is in the on-state, and the fourth switching element 324 is in the off-state. The control circuit 330 repeatedly switches the first switching element 321 between the on-state and the off-state, so as to control the current flowing through the first inductor wiring line 20R. When the first switching element 321 is in the on-state, in the state where the third terminal 80C is connected to the output terminal 302, the first terminal 80A is connected to the input terminal 301. With this configuration, in the switch circuit 320, only the first inductor wiring line 20R is in the on-state as connected to between the input terminal 301 and the output terminal 302. On the other hand, when the first switching element 321 is in the off-state, the fifth switching element 325 is in the on-state, so that the first terminal 80A is connected to the first grounding terminal 303. With this configuration, in the switch circuit 320, only the first inductor wiring line 20R is in the off-state as connected to between the first grounding terminal 303 and the output terminal 302. In the second circuit state for only the first inductor wiring line 20R, only the first inductor wiring line 20R is switched between the on-state and the off-state as has been described above, so that the power supply voltage is stepped down to be supplied to the load.

Figure 27:
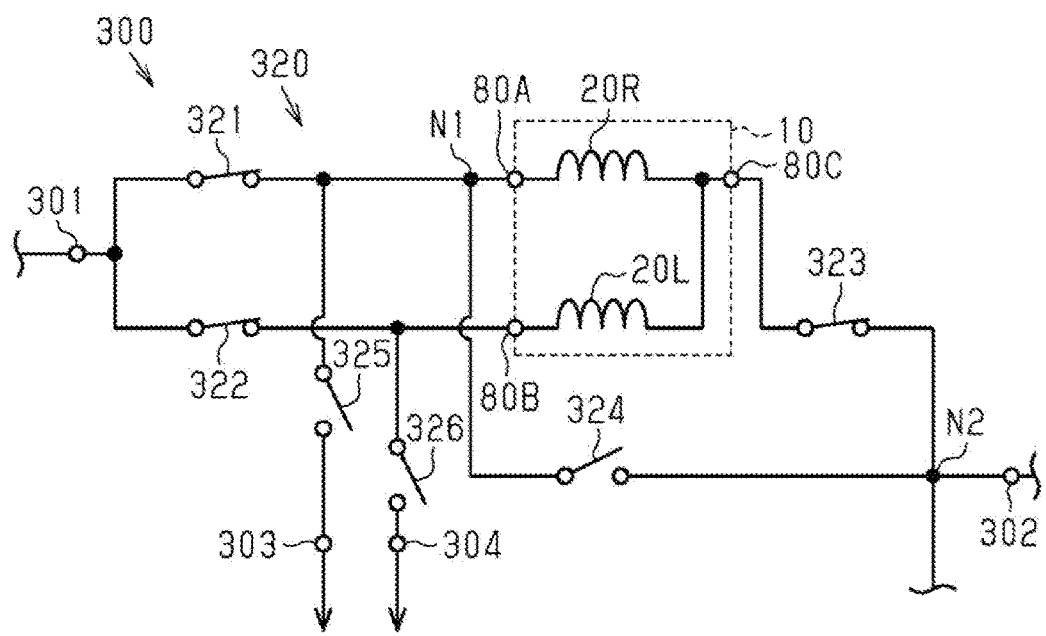
FIG. 27 illustrates an operating state of the DC/DC converter component according to the embodiment.

As illustrated in FIG. 27, when the current value detected by the ammeter 340 is equal to or greater than the third predetermined value, the control circuit 330 switches the switch circuit 320 to a third circuit state. When the switch circuit 320 is in the third circuit state, the third switching element 323 is in the on-state, and the fourth switching element 324 is in the off-state. The control circuit 330 simultaneously switches the first switching element 321 and the second switching element 322 between the on-state and the off-state. In other words the first inductor wiring line 20R and the second inductor wiring line 20L are connected in parallel. With this configuration, the control circuit repeatedly and simultaneously switches the first switching element 321 and the second switching element 322 between the on-state and the off-state, so as to control the current flowing through the first inductor wiring line 20R and the second inductor wiring line 20L connected in parallel. When the first switching element 321 and the second switching element 322 are in the on-state, in the state where the third terminal 80C is connected to the output terminal 302, the first terminal 80A and the second terminal 80B are connected to the input terminal 301. With this configuration, in the switch circuit 320, the first inductor wiring line 20R and the second inductor wiring line 20L, which are connected in parallel, are in the on-state as connected to between the input terminal 301 and the output terminal 302. On the other hand, when the first switching element 321 is in the off-state, the fifth switching element 325 is in the on-state, so that the first terminal 80A is connected to the first grounding terminal 303. Further, when the second switching element 322 is in the off-state, the sixth switching element 326 is in the on-state, so that the second terminal 80B is connected to the second grounding terminal 304. With this configuration, in the switch circuit 320, the first inductor wiring line 20R and the second inductor wiring line 20L, which are connected in parallel, are in the off-state, as connected to between the first grounding terminal 303 and the output terminal 302, and as connected to between the second grounding terminal 304 and the output terminal 302. In the third circuit state, the first inductor wiring line 20R and the second inductor wiring line 20L, which are connected in parallel, are switched between the on-state and the off-state as has been described above, so that the power supply voltage is stepped down to be supplied to the load.

Note that, with a step-down converter such as in this embodiment, in order to acquire an output voltage at desired value, an input voltage of a pulse waveform is supplied to each of the first switching element 321 and the second switching element 322 at a duty ratio within a range from "zero" to "one", both inclusive, the duty ratio as a ratio of the output voltage to the input voltage.

Next, operations in the foregoing embodiment will be described.

When the current is supplied from the power supply 210 to the inductor component 10, each of the inductor wiring lines 20 has a length of a path where the current flows, the length varying in accordance with the state of the switch circuit 320. Thus, the inductor wiring lines 20 acquire various inductance values.

Specifically, when the switch circuit 320 is in the first circuit state as illustrated in FIG. 24, the current is inputted to the second terminal 80B and outputted from the first terminal 80A. In this state, in the inductor component 10, the current flows in series through the second wiring line body 21L of the second inductor wiring line 20L as well as the first wiring line body 21R of the first inductor wiring line 20R. With this configuration, in the first circuit state, the inductor wiring line has the length of the path where the current flows, the length being equal to a sum of the wiring line length of the first wiring line body 21R, the wiring line length of the second wiring line body 21L, and a wiring line length of the first pad 22L. Accordingly, an inductance value in total acquired in the first circuit state is greater than each of the inductance value of the first inductor wiring line 20R and the inductance value of the second inductor wiring line 20L. For example, the inductance value in the first circuit state is approximately 5.5 nH in this embodiment. In the first circuit state, a DC resistance value is 50 mΩ or less.

As illustrated in FIG. 25, when the switch circuit 320 is in the second circuit state for only the second inductor wiring line 20L, the current is inputted to the second terminal 80B and outputted from the third terminal 80C. In this state, in the inductor component 10, the current is inputted to the first external terminal 81 connected to the first pad 22L that the second inductor wiring line 20L has, and outputted from the second external terminal 82 connected to the second pad 23R that the second inductor wiring line 20L and the first inductor wiring line 20R share. With this configuration, in the second circuit state for only the second inductor wiring line 20L, the inductor wiring line has the length of the path where the current flows, the length equal to the wiring line length of the second inductor wiring line body 20L. In other words, in the second circuit state for only the second inductor wiring line 20L, the current flows through the path, the length of which is smaller than the length of the path in the first circuit state; and thus, an inductance value acquired is smaller than the inductance value acquired in the first circuit state. Specifically, the inductance value in the second circuit state for only the second inductor wiring line 20L is, for example, 3.3 nH in this embodiment.

As illustrated in FIG. 26, when the switch circuit 320 is in the second circuit state for only the first inductor wiring line 20R, the current is inputted to the first terminal 80A and outputted from the third terminal 80C. In this state, in the inductor component 10, the current is inputted to the first external terminal 81 connected to the first pad 22R of the first inductor wiring line 20R, and outputted from the second external terminal 82 connected to the second pad 23R of the first inductor wiring line 20R. With this configuration, in the second circuit state for only the first inductor wiring line 20R, the inductor wiring line 20 has the length of the path where the current flows, the length equal to the wiring line length of the first inductor wiring line body 20R. As has been described above, the inductance value of the first inductor wiring line 20R is, for example, approximately 2.5 nH. The inductance value of the first inductor wiring line 20R is minimum among the inductance values obtained in this embodiment. With this configuration, in the second circuit state for only the second inductor wiring line 20L, the inductance value is 1.1 times or more greater than the inductance value in the second circuit state for only the first inductor wiring line 20R.

As illustrated in FIG. 27, when the switch circuit 320 is in the third circuit state, the current is inputted to the first terminal 80A and the second terminal 80B, and outputted from the third terminal 80C. In this state, in the inductor component 10, the current flows in parallel through the first wiring line body 21R of the first inductor wiring line 20R and through the second wiring line body 21L of the second inductor wiring line 20L. In the third circuit state, the first switching element 321 and the second switching element 322 have a phase difference of 0°.

Next, effects of the foregoing embodiment will be described.

(1) In the foregoing embodiment, the inductor component 10 has a dimension of approximately 0.2 millimeters in the thickness direction Td. With this configuration, when the inductor component 10 has been mounted to the package substrate 350, a dimension that the package substrate 350 has in the thickness direction Td is not excessively large. The inductor component 10 may be mounted to the package substrate 350 without being mounted to the motherboard 220. Accordingly, with the DC/DC converter component 300 of the foregoing embodiment, the motherboard 220 is required to have a less mounting area.

(2) In the foregoing embodiment, the inductor component 10 is installed inside the package substrate 350. With this configuration, it is not required to adjust a positional relationship between the semiconductor integrated circuit 310 and the inductor component 10 on an outer face of the package substrate 350, thereby providing more freedom of arrangement of the semiconductor integrated circuit 310.

(3) In the foregoing embodiment, when viewed in the thickness direction Td, the inductor component 10 is arranged to overlap the semiconductor integrated circuit 310. With this configuration, the package substrate 350 may not necessarily be increased in size in the length direction Ld or in the width direction Wd.

(4) In the foregoing embodiment, with each of the inductor components 10, it is possible to acquire the inductance value in each of the first circuit state and the second circuit state. Thus, with the inductor components 10, it is possible to acquire various inductance values in accordance with the usage conditions. Specifically, the switch circuit 320 is controlled such that, when the current flowing through the microprocessor 500 as the load increases, the inductance value acquired by the inductor component 10 decreases. Consequently, operating efficiency of the DC/DC converter component 300 is increased.

(5) In the foregoing embodiment, with each of the inductor components 10, it is possible to acquire the inductance value in the third circuit state by flowing the current through the inductor wiring lines 20 connected in parallel. With this configuration, the inductor component 10 acquires a wider range of the inductance values.

(6) In the foregoing embodiment, each of the first magnetic layer 54 and the second magnetic layer 55 is formed of the resin composite material containing the metal magnetic powder. The metal magnetic powder is the alloy containing iron, and has the average particle diameter of approximately 5 micrometers. As has been described above, the magnetic powder having a small particle diameter of 10 micrometers or less, is used. In this state, a magnetic permeability is maintained and concurrently, an eddy current loss is less prone to occur in the magnetic powder so that an iron loss is reduced. Accordingly, an inductor component having a high quality factor Q is provided.

(7) The first inductor wiring line 20R has the inductance value of approximately 3 nH, and the second inductor wiring line 20L has the inductance value of, for example, 3.3 nH. With a converter in a high-frequency switching operation, an inductance value of an inductor wiring line is preferably 1 nH or more such that a ripple current is less prone to occur. Concurrently, when the inductance value of each of the inductor wiring lines 20 is 10 nH or more, a follow-up performance in variation of the voltage, the follow-up performance in the high-frequency switching operation, is deteriorated. Thus, the inductance value of each of the inductor wiring lines 20 preferably ranges from 1 nH to 10 nH, both inclusive; and in this embodiment, the inductance value of each of the inductor wiring lines 20 is within the range described above. Further, the inductor component 10 has DC resistance that is not excessively large, so that the efficiency of the DC/DC converter component 300 is less prone to decrease. The switching frequency is preferably 50 MHz or more, and more preferably, is 100 MHz or more. Concurrently, the switching frequency is preferably 1000 MHz or less. When the switching frequency is too high, loss in the magnetic powder increases and thus the loss in the switching element increases, thereby resulting in a lower efficiency of the DC/DC converter.

In the foregoing embodiment, modifications may be made as will be described below. The foregoing embodiment above and the modifications below may be combined as long as no conflict arises.

Figure 28:
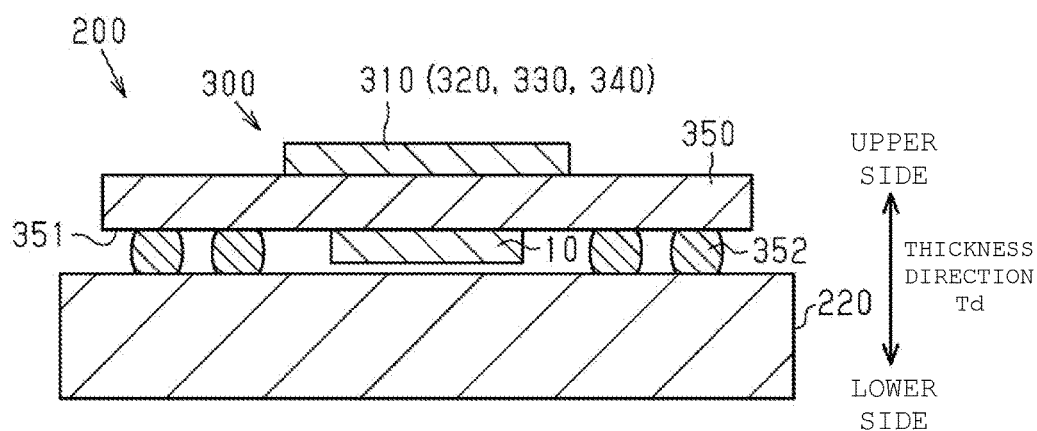
FIG. 28 is a schematic diagram of an electronic device including a DC/DC converter component according to a modification.

The inductor component 10 is mounted at a position on the package substrate 350, the position that is not limited to the foregoing embodiment. For example, in an example illustrated in FIG. 28, the inductor component 10 is mounted to the mounting face 351 of the package substrate 350. The inductor component 10 is smaller in dimension in the thickness direction Td than the solder 351. In this case, the solder creates a dead space that may be used as a space for mounting the inductor component 10. In this case, when viewed in the thickness direction Td, the inductor component 10 is arranged to overlap the semiconductor integrated circuit 310; and here, the space may be used more effectively.

Alternatively, the inductor component 10 may be mounted to, for example, the face of the package substrate 350 opposite the mounting face 351. As in these modifications, the inductor component 10 is required to be mounted at least to the package substrate 350.

When the inductor component 10 is installed inside the package substrate 350, the inductor components 10 may not necessarily be wholly embedded in the package substrate 350. The inductor component 10 is required to have at least a part thereof installed in the package substrate 350.

Figure 29:
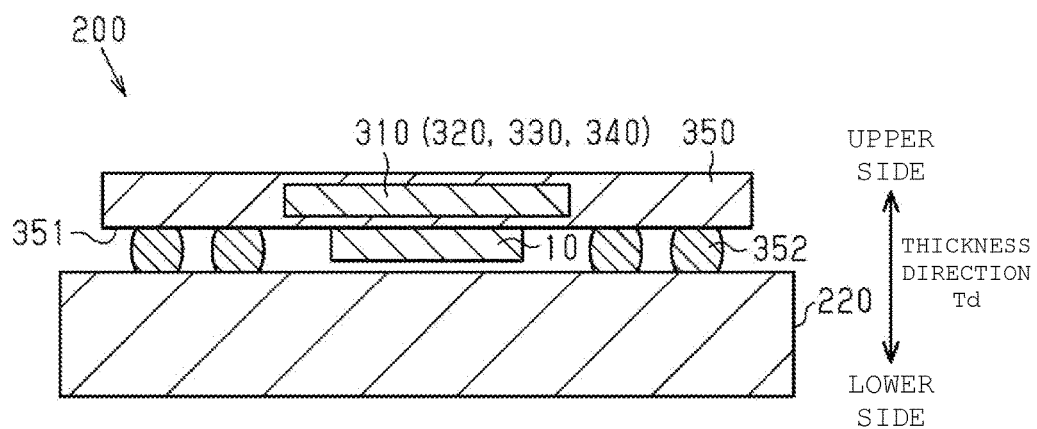
FIG. 29 is a schematic diagram of an electronic device including a DC/DC converter component according to a modification.
Figure 30:
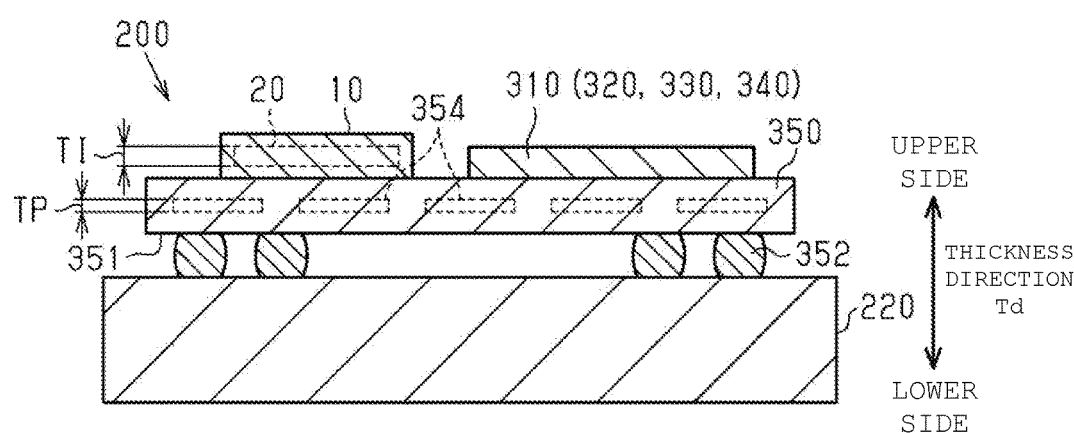
FIG. 30 is a schematic diagram of an electronic device including a DC/DC converter component according to a modification.

The semiconductor integrated circuit 310 is mounted at a position on the package substrate 350, the position that is not limited to the foregoing embodiment. For example, in an example illustrated in FIG. 29, the semiconductor integrated circuit 310 is installed inside the package substrate 350. In this case, as compared with a case where the semiconductor integrated circuit 310 is mounted to a face of the package substrate 350, the DC/DC converter component 300 may be reduced in dimension in the thickness direction Td by an amount equal to an embedded dimension of the semiconductor integrated circuit 310 in the package substrate 350. As long as the inductor component 10 has the dimension of 0.25 millimeters or less in the thickness direction Td, the dimension may be greater than the dimension that the wiring lines of the package substrate 350 has in the thickness direction Td. In an example illustrated in FIG. 30, the package substrate 350 has package substrate wiring lines 354 therein, and each of the package substrate wiring lines 354 extends in parallel with the mounting face 351. Here, the inductor wiring line 20 of the inductor component 10 has a dimension TI in the thickness direction Td, the dimension TI greater than a dimension TP that each of the package substrate wiring lines 354 has in the thickness direction Td. In this case, as compared with a case where the inductor wiring line extending along the mounting face 351 is provided inside the package substrate 350, the inductor wiring line has a greater dimension in the thickness direction Td, thereby resulting in an inductor wiring line having a greater sectional area. Consequently, the inductor wiring line has smaller DC resistance.

In the DC/DC converter component 300, two or more of the inductor components 10 may be included. In an example illustrated in FIG. 31, three of the inductor components 10 are mounted to the mounting face 351 of the package substrate 350. In a case where the plurality of inductor components 10 are included as illustrated here, it is easier to downsize the DC/DC converter component 300 than a case where a large-sized inductor component is used.

In the foregoing embodiment, when the switch circuit 320 is in the first circuit state, the current may flow from the first inductor wiring line 20R to the second inductor wiring line 20L. In this case, the first end of the fourth switching element 324 is connected to between the second switching element 322 and the second terminal 80B, and each of the switching elements 321 to 326 is switched between the on-state and the off-state.

In the foregoing embodiment, when the switch circuit 320 is in the second circuit state, the second circuit state may be at least for any one of the first inductor wiring line 20R and the second inductor wiring line 20L. In other words, for example, the second circuit state for only the first inductor wiring line 20R may be omitted.

In the foregoing embodiment, when the switch circuit 320 is in the third circuit state, the first switching element 321 and the second switching element 322 are simultaneously switched between the on-state and the off-state and thus have the phase difference of 0°. Alternatively, the first switching element 321 and the second switching element 322 may drive at a predetermined phase difference, so that the DC/DC converter component 300 may serve as a multiphase DC/DC converter. The first switching element 321 and the second switching element 322 may have a phase difference of, for example, 180°. When the third switching element 323 is in the on-state and the fourth switching element 324 is in the off-state, the switch circuit 320 may be switched between the following states: a state where the first switching element 321 is in the on-state and the second switching element 322 is in the off-state, and a state where the first switching element 321 is in the off-state and the second switching element 322 is in the on-state. In this case, when the first switching element 321 is in the on-state and the second switching element 322 is in the off-state, only the first inductor wiring line 20R is in the on-state as connected to between the input terminal 301 and the output terminal 302. Here, only the second inductor wiring line 20L is in the off-state as connected to between the second grounding terminal 304 and the output terminal 302. On the other hand, when the first switching element 321 is in the off-state and the second switching element 322 is in the on-state, only the first inductor wiring line 20R is in the off-state as connected between the first grounding terminal 303 and the output terminal 302. Here, only the second inductor wiring line 20L is in the on-state as connected to between the input terminal 301 and the output terminal 302. As has been described above, the switch circuit 320 is in a second-(1) circuit state where only the first inductor wiring line 20R is in the power-on state such that the power supply voltage is stepped down to be supplied to the load, or in a second-(2) circuit state where only the second inductor wiring line 20L is in the power-on state such that the power supply voltage is stepped down to be supplied to the load. Alternatively, the switch circuit 320 may be simultaneously in the second-(1) circuit state and in the second-(2) circuit state. Then, this modification results in a two-phase configuration where ripple currents cancel each other.

In the case where three of the inductor components 10 are included in the DC/DC converter component 300, the control circuit 330 may be configured to control the switch circuit 320 such that, when the current value detected by the ammeter 340 is greater, the number of the inductor components 10 where the current flows in parallel is greater. For example, when the current value detected by the ammeter 340 is correspondingly small, the control circuit 330 may control the switch circuit 320 such that the current flows only through the first inductor wiring line 20R in one of the inductor components. When the current value detected by the ammeter 340 increases, the control circuit 330 may switch the switch circuit 320 between a state where the current flows only through the first inductor wiring line 20R in two of the inductor components 10 and a state where the current flows only through the first inductor wiring line 20R in the three of the inductor component 10. When the current value detected by the ammeter 340 further increases, the control circuit 330 may switch the switch circuit 320 to the third circuit state in one of all the three of the inductor components 10. When the current value detected by the ammeter 340 still further increases, the control circuit 330 may switch the switch circuit 320 to the third circuit state or to the multiphase state in all the three of the inductor components 10.

In the case where the current flows in parallel through the plurality of inductor components 10, the DC resistance of each of the inductor components 10 preferably matches those of the others of the inductor components 10. For example, in the case where the current flows in parallel through three of the inductor components 10, the switch circuit 320 in all the three of the inductor components 10 may preferably be in the second circuit state for only the first inductor wiring line 20R or in the second circuit state for only the second inductor wiring line 20L. Note that, in a case where the current flows in parallel through all the three of the inductor components 10 in accordance with the current value of the current flowing to the microprocessor 500, the switch circuit 320 in one of the inductor components 10 may be in the third state and the switch circuit 320 in each of the other two of the inductor components 10 may be in the first circuit state. In each of the circuit states, for example, in the second circuit state for only the first inductor wiring line 20R, the inductor components may be used as multiphase inductors. In this case, a phase difference in the multiphase conductors may be preferably as follows: 180° between two phases, 120° between three phases, 90° between four phases; and in a case of N phases, 360° is to be divided by N.

In the foregoing embodiment, the switch circuit 320 is switched between the states, but not in the manner limited to the foregoing embodiment. For example, the third circuit state may be excluded, and each of the switch circuits 320 may be controlled to be in any one of the remaining circuit states. The switch circuit 320 may be switched between the states in a manner modified as appropriate.

In the foregoing embodiment, the DC/DC converter component 300 to be operated may include the power supply and a connecting terminal thereof, a smoothing capacitor at the input terminal 301 side, a feedback circuit for detecting the state of the output voltage or an abnormal state of the load and a connecting terminal thereof, and the like. These components are omitted in the foregoing embodiment; but alternatively, these components may be additionally provided or modified as appropriate.

In the foregoing embodiment, the fifth switching element 325 may be a diode. Similarly, the sixth switching element 326 may be a diode.

Figure 31:
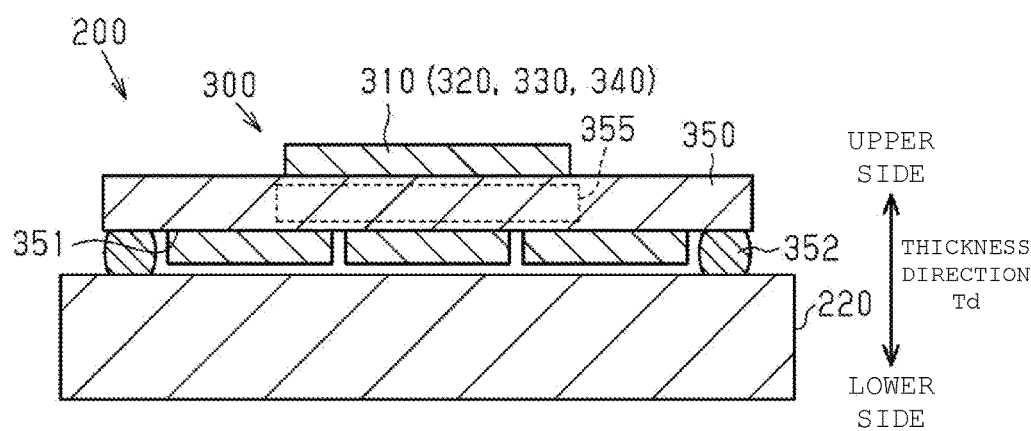
FIG. 31 is a schematic diagram of an electronic device including a DC/DC converter component according to a modification.

In the example illustrated in FIG. 31, in the package substrate 350, an air-core inductor component 355 is installed separately from the inductor component 10. The air-core inductor component 355 includes a wiring line having the number of turns greater than 0.5 turns, and the wiring line wound includes no magnetic material therein. The wiring line is wound inside the package substrate 350. In this case, the number of the inductor wiring lines mounted to the package substrate 350 may be increased.

Figure 32:
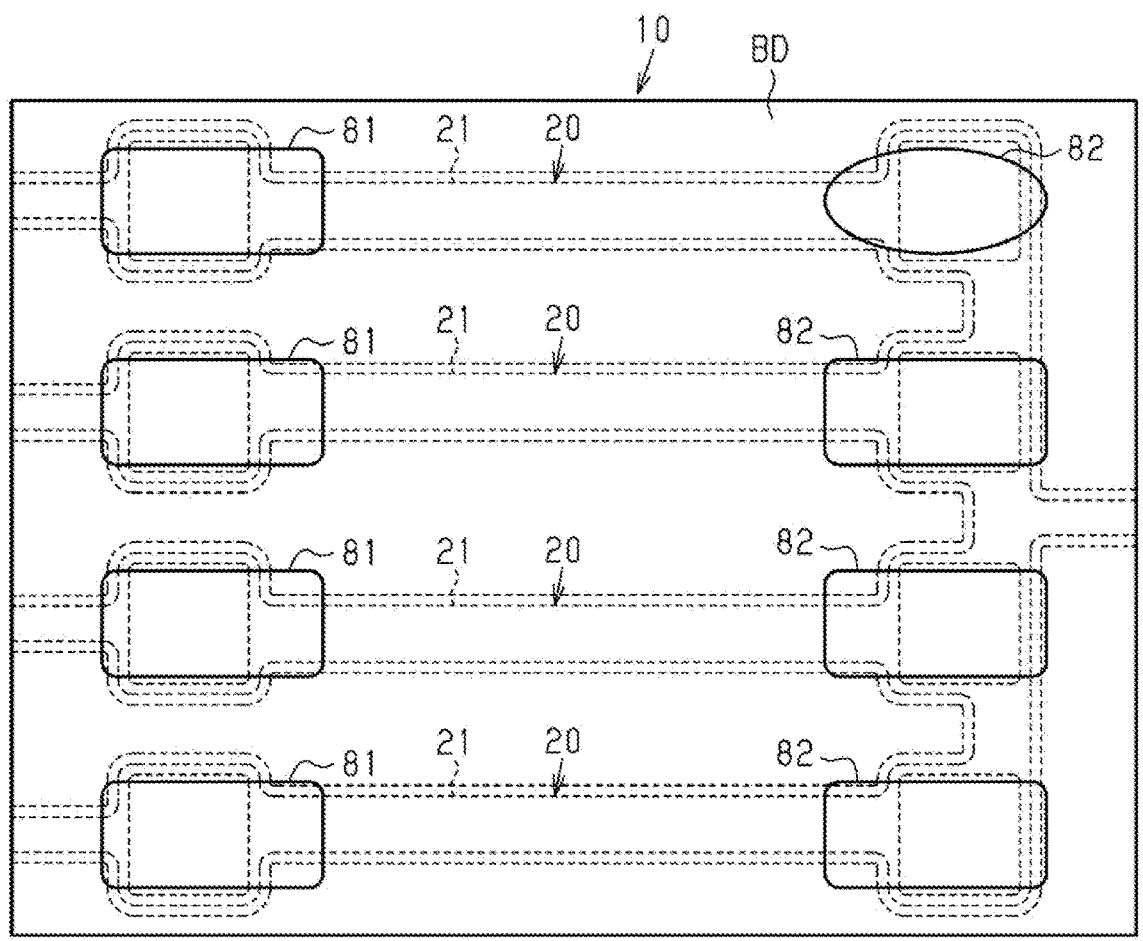
FIG. 32 is a transparent top view of an inductor component according to a modification.

In the inductor component 10, three or more of the inductor wiring lines 20 may be included in the element body BD. In an example illustrated in FIG. 32, four of the inductor wiring lines 20 are included. In the example illustrated in FIG. 32, each of the inductor wiring lines 20 includes the first external terminal 81 and the second external terminal 82. Note that, the plurality of inductor wiring lines 20 may not necessarily include a shared external terminal. The switch circuit 320 may be modified as appropriate such that the current flows in series or in parallel through the plurality of inductor wiring lines 20. In this case, for example, when the second external terminals 82 of the inductor wiring lines 20 are connected at the outside as a circuit, each of the second external terminals 82 functions as the third terminal.

With regard to the inductance value of the first inductor wiring line 20R and the inductance value of the second inductor wiring line 20L in the inductor component 10, the second inductor wiring line 20L may be 10% or more greater in inductance value than the first inductor wiring line 20R. The second inductor wiring line 20L may have a further greater value of the inductance by, for example, having the wiring line length thereof extended.

In the foregoing embodiment, the average particle diameter of the metal magnetic powder contained in the magnetic layer 50 is not limited to the example of the foregoing embodiment. However, in order to secure a relative permeability, the average particle diameter of the metal magnetic powder is preferably 1 micrometer or more to 10 micrometers or less (i.e., from 1 micrometer to 10 micrometers).

In the foregoing embodiment, the metal magnetic powder contained in each of the first magnetic layer 54 and the second magnetic layer 55 may not necessarily be Fe-based. The metal magnetic powder may be, for example, FeNi-based or FeSiCr-based.

In the foregoing embodiment, the inductor wiring lines 20 adjoining each other have a minimum distance therebetween, and the minimum distance may not necessarily correspond to a distance between the pads of the inductor wiring lines 20; alternatively, the minimum distance may correspond to the distance between the wiring line bodies 21. However, in view of insulation between the inductor wiring lines 20, the minimum distance is preferably 50 micrometers or more.

In the foregoing embodiment, each of the inductor wiring lines 20 may be any one of wiring lines that, when the current flows therethrough, generate a magnetic flux in the magnetic layers to provide the inductance to the inductor component 10.

In the foregoing embodiment, the composition of each of the inductor wiring lines 20 is not limited to the example of the foregoing embodiment. For example, each of the inductor wiring lines 20 may be composed of silver or gold.

In the foregoing embodiment, the composition of the magnetic layer 50 is not limited to the example of the foregoing embodiment. For example, the magnetic layer 50 may be formed of ferrite powder or a mixture of ferrite powder and metal magnetic powder.

In the foregoing embodiment, the magnetic layer 50 and each of the support wiring lines 41 and 42 may have another layer interposed therebetween. For example, the magnetic layer 50 and each of the support wiring lines 41 and 42 may have an insulating layer interposed therebetween.

In the foregoing embodiment, the first vertical wiring lines 71 and the second vertical wiring line 72 may not necessarily extend in the direction orthogonal to the main fac e MF. For example, the first vertical wiring lines 71 and the second vertical wiring line 72 may be inclined with respect to the thickness direction Td, as long as each of the first vertical wiring lines 71 and the second vertical wiring line 72 pierces through the second magnetic layer 55.

In the foregoing embodiment, when viewed in the thickness direction Td, each of the first pad 22R and the first pad 22L may have an area equal to the area of a corresponding one of the first vertical wiring lines 71; and the second pad 23R may have an area equal to the area of the second vertical wiring line 72. Further, each of the first pad 22R, the first pad 22L, and the second pad 23R may have a dimension in the direction orthogonal to the direction where a corresponding one of the wiring line bodies extends, the dimension equal to the dimension of the corresponding one of the wiring line bodies.

In the foregoing embodiment, the first external terminals 81 and the second external terminal 82 may be omitted. As long as the first vertical wiring lines 71 and the second vertical wiring line 72 are exposed from the main face MF, the current may flow directly from the first vertical wiring lines 71 and the second vertical wiring line 72 to the inductor wiring lines 20. In this case, portions of the first vertical wiring lines 71 exposed from the main face MF and a portion of the second vertical wiring line 72 exposed from the main face MF respectively function as external terminals.

In the foregoing embodiment, in the inductor component 10 that is not yet mounted to the substrate or the like, each of the first external terminals 81 and the second external terminal 82 may have an outer face covered with an insulating layer. In this case, in the state where the inductor component 10 is not yet mounted to the substrate or the like, an unwanted current is less prone to flow into the inductor component 10 via each of the external terminals. Note that, in this modification, before the inductor component 10 is mounted to the substrate or the like, the insulating layer covering the first external terminals 81 and the second external terminal 82 may be removed by cleaning or others.

The first external terminals 81 and the second external terminal 82 may respectively have the metal layers formed of nickel and gold or formed of nickel and tin. Further, The first external terminals 81 and the second external terminal 82 may respectively have a catalyst layer as necessary. For example, nickel suppresses electromigration, and gold or tin secures solder wettability; and in accordance with each of these functions, it is possible to adequately prepare the metal layer of each of the external terminals.

In the foregoing embodiment, the dummy portion 83 may not have the same multilayer configuration as the first external terminals 81 and the second external terminal 82. For example, the dummy portion 83 may not be formed of the conductive material. Further, the dummy portion 83 may be, for example, a portion of the second magnetic layer 55, the portion exposed from the insulating layer 90.

In the foregoing embodiment, when viewed in the thickness direction Td, the dummy portion 83 may have an area that is different from the area of each of the first external terminals 81 and the second external terminal 82.

In the foregoing embodiment, the dummy portion 83 may not be provided.

In the foregoing embodiment, the number of the support wiring lines exposed to the first side face 93 or the second side face 94 may be modified as appropriate or may be omitted altogether.

In the foregoing embodiment, the method for manufacturing the inductor component 10 is not limited to the example of the foregoing embodiment. For example, in the foregoing embodiment, the process where the inductor wiring lines 20 are formed may be different from the process where the first support wiring lines 41 and the second support wiring line 42 are formed. For example, when the inductor wiring lines 20 have been formed, the support wiring lines 41 and the support wiring line 42 may be formed of a material that is different from the material of the inductor wiring line 20.

What is claimed is:

1. A DC/DC converter component comprising:
   at least one inductor component;
   a semiconductor integrated circuit including a switch circuit connected to the inductor component, and a control circuit configured to control the switch circuit; and
   a package substrate to which the semiconductor integrated circuit is mounted, the package substrate having a mounting face configured to oppose an other substrate when the package substrate is mounted to the other substrate,
   the inductor component including:
   an element body including a magnetic layer including a magnetic material, and having a main face in parallel with the mounting face;
   a plurality of inductor wiring lines, each extending in the element body and in parallel with the main face; and
   a vertical wiring line extending from each of the inductor wiring lines in a thickness direction orthogonal to the main face, and being exposed from the main face,
   each of the inductor wiring lines having a number of turns equal to or less than 0.5 turns, and
   the inductor component having, in the thickness direction, a dimension equal to or less than 0.25 millimeters.

2. The DC/DC converter component according to claim 1, wherein
   at least a part of the inductor component is installed in the package substrate.

3. The DC/DC converter component according to claim 2, wherein
   the semiconductor integrated circuit is installed in the package substrate.

4. The DC/DC converter component according to claim 2, wherein
   the package substrate includes a package substrate wiring line extending in parallel with the mounting face, and
   the inductor wiring line has a dimension in the thickness direction greater than a dimension in the thickness direction of the package substrate wiring line.

5. The DC/DC converter component according to claim 2, wherein
   the at least one inductor component is a plurality of the inductor components.

6. The DC/DC converter component according to claim 2, wherein
   an air-core inductor component is installed in the package substrate, separately from the inductor component, and
   the air-core inductor component includes a wiring line that has the number of turns greater than 0.5 turns.

7. The DC/DC converter component according to claim 2, wherein
   the first inductor wiring line and the second inductor wiring line are connected to each other in the inductor component.

8. The DC/DC converter component according to claim 1, wherein
   the semiconductor integrated circuit is installed in the package substrate.

9. The DC/DC converter component according to claim 1, wherein
a solder is provided on the mounting face of the package substrate, the solder being configured to electrically connect the package substrate to the other substrate,
the solder has a dimension in the thickness direction greater than the dimension in the thickness direction that the inductor component has, and
the inductor component is mounted to the mounting face.

10. The DC/DC converter component according to claim 9, wherein
the semiconductor integrated circuit is mounted to a face of the package substrate, the face being opposite the mounting face, and
when viewed in the thickness direction, the inductor component is arranged at a position to overlap the semiconductor integrated circuit.

11. The DC/DC converter component according to claim 1, wherein
the package substrate includes a package substrate wiring line extending in parallel with the mounting face, and
the inductor wiring line has a dimension in the thickness direction greater than a dimension in the thickness direction of the package substrate wiring line.

12. The DC/DC converter component according to claim 1, wherein
the at least one inductor component is a plurality of the inductor components.

13. The DC/DC converter component according to claim 1, wherein
an air-core inductor component is installed in the package substrate, separately from the inductor component, and
the air-core inductor component includes a wiring line that has the number of turns greater than 0.5 turns.

14. The DC/DC converter component according to claim 1, wherein
the first inductor wiring line and the second inductor wiring line are connected to each other in the inductor component.

15. The DC/DC converter component according to claim 14, further comprising:
an input terminal to which a power supply voltage is inputted, an output terminal to which a load is connected, and a grounding terminal for grounding, wherein
the switch circuit is configured to switch between a first circuit state and a second circuit state,
the first circuit state is configured to step down the power supply voltage and supply to the load, by the control circuit switching between an on-state and an off-state of a series connection of the first inductor wiring line and the second inductor wiring line, the on-state being a state in which the series connection of the first inductor wiring line and the second inductor wiring line is connected between the input terminal and the output terminal, and the off-state being a state in which the series connection of the first inductor wiring line and the second inductor wiring line is connected between the grounding terminal and the output terminal,
the second circuit state is configured to step down the power supply voltage and supply to the load, by the control circuit switching between the on-state and the off-state of one of the first inductor wiring line and the second inductor wiring line, the on-state being the state in which the one of the first inductor wiring line and the second inductor wiring line is connected between the input terminal and the output terminal, and the off-state being the state in which the one of the first inductor wiring line and the second inductor wiring line is connected between the grounding terminal and the output terminal.

16. The DC/DC converter component according to claim 15, wherein
the switch circuit is further configured to switch to a third circuit state, wherein
the third circuit state is configured to step down the power supply voltage and supply to the load, by the control circuit switching between an on-state and an off-state of a parallel connection of the first inductor wiring line and the second inductor wiring line, the on-state being a state in which the parallel connection of the first inductor wiring line and the second inductor wiring line is connected between the input terminal and the output terminal, and the off-state being a state in which the parallel connection of the first inductor wiring line and the second inductor wiring line is connected between the grounding terminal and the output terminal.

17. The DC/DC converter component according to claim 1, further comprising:
an input terminal to which a power supply voltage is inputted, an output terminal to which a load is connected, and a grounding terminal for grounding, wherein
the switch circuit is simultaneously in a second-(1) circuit state and in a second-(2) circuit state,
the second-(1) circuit state is configured to step down the power supply voltage and supply to the load, by the control circuit switching between an on-state in which only the first inductor wiring line is connected between the input terminal and the output terminal and an off-state in which only the first inductor wiring line is connected between the grounding terminal and the output terminal,
the second-(2) circuit state is configured to step down the power supply voltage and supply to the load, by the control circuit switching between the on-state in which only the second inductor wiring line is connected between the input terminal and the output terminal and the off-state in which only the second inductor wiring line is connected between the grounding terminal and the output terminal, and
the control circuit is configured to cause the switch circuit to perform switching between the on-state and the off-state in the second-(1) circuit state, and switching between the on-state and the off-state in the second-(2) circuit state at a predetermined phase difference.

18. The DC/DC converter component according to claim 1, wherein
the magnetic layer contains a metal powder including an iron, and
the metal powder has an average particle diameter that ranges from 1 micrometer to 10 micrometers, both inclusive.

19. The DC/DC converter component according to claim 1, wherein
when a current is flowed through the inductor component, a minimum value of the inductance obtained is equal to or more than 1 nH and a maximum value of the inductance is equal to or less than 10 nH, and
the inductor component has a maximum value of a direct current resistance that ranges from 1 mΩ to 50 mΩ, both inclusive.

20. A DC/DC converter component comprising:
at least one inductor component;

a semiconductor integrated circuit including a switch circuit connected to the inductor component, and a control circuit configured to control the switch circuit; and a package substrate to which the semiconductor integrated circuit is mounted, the package substrate having a mounting face configured to oppose an other substrate when the package substrate is mounted to the other substrate, the inductor component including a first inductor portion and a second inductor portion and each of the first inductor portion and the second inductor portion including:

an element body including a magnetic layer including a magnetic material, and having a main face in parallel with the mounting face;

an inductor wiring line extending in the element body and in parallel with the main face; and a vertical wiring line extending from each of the inductor wiring lines in a thickness direction orthogonal to the main face, and being exposed from the main face, each of the inductor wiring lines having a number of turns equal to or less than 0.5 turns, when the inductor wiring line which the first inductor portion includes is defined as a first inductor wiring line and the inductor wiring line which the second inductor portion includes is defined as a second inductor wiring line, a value of an inductance of the second inductor wiring line being 10% or more greater than a value of an inductance of the first inductor wiring line, the inductor component having, in the thickness direction, a dimension equal to or less than 0.25 millimeters.

* * * * *